(12) United States Patent
Kimura

(10) Patent No.: US 11,468,849 B2
(45) Date of Patent: Oct. 11, 2022

(54) SOURCE DRIVER, DISPLAY APPARATUS, AND ELECTRONIC APPARATUS

(71) Applicant: Sony Corporation, Tokyo (JP)

(72) Inventor: Kei Kimura, Kanagawa (JP)

(73) Assignee: Sony Group Corporation, Tokyo (JP)

( * ) Notice: Subject to any disclaimer, the term of this patent is extended or adjusted under 35 U.S.C. 154(b) by 581 days.

(21) Appl. No.: 15/779,190

(22) PCT Filed: Jan. 16, 2017

(86) PCT No.: PCT/JP2017/001190
§ 371 (c)(1),
(2) Date: May 25, 2018

(87) PCT Pub. No.: WO2017/145568
PCT Pub. Date: Aug. 31, 2017

(65) Prior Publication Data
US 2019/0385538 A1    Dec. 19, 2019

(30) Foreign Application Priority Data

Feb. 23, 2016 (JP) .............................. JP2016-032045

(51) Int. Cl.
*G09G 3/3291* (2016.01)
*G09G 3/3233* (2016.01)

(52) U.S. Cl.
CPC ......... *G09G 3/3291* (2013.01); *G09G 3/3233* (2013.01); *G09G 2310/027* (2013.01)

(58) Field of Classification Search
CPC ............... G09G 3/3291; G09G 3/3233; G09G 2310/027
See application file for complete search history.

(56) References Cited

U.S. PATENT DOCUMENTS 4,536,702 A * 8/1985 Nagano .................... G05F 3/227
                                                      323/314
5,570,105 A * 10/1996 Koyama ............... G09G 3/3688
                                                      345/98

(Continued)

FOREIGN PATENT DOCUMENTS

CN         1559064 A       12/2004
CN         1629760 A        6/2005
                (Continued)

OTHER PUBLICATIONS

Chinese Office Action dated Jan. 6, 2021 for corresponding Chinese Application No. 2017800117229.

(Continued)

*Primary Examiner* — Amy Onyekaba
(74) *Attorney, Agent, or Firm* — Michael Best & Friedrich LLP

(57) ABSTRACT

Provided is a source driver that is used for supplying a voltage corresponding to a gradation value of a video signal to a data line of a display unit, the source driver including: a resistor having an end to which a predetermined power supply voltage is applied; and a current source that is connected to another end of the resistor, the amount of current of the current source being controlled according to the gradation value of the video signal, the voltage corresponding to the gradation value of the video signal being supplied from the other end of the resistor.

19 Claims, 17 Drawing Sheets

(56) References Cited

U.S. PATENT DOCUMENTS

| | | | | |
|---|---|---|---|---|
| 5,714,968 A * | 2/1998 | Ikeda | G09G 3/3233 | 345/80 |
| 6,091,381 A * | 7/2000 | Uenuma | G09G 3/2011 | 345/74.1 |
| 6,489,994 B1 * | 12/2002 | Chang-Fa | G09G 1/002 | 348/E5.134 |
| 6,556,182 B1 * | 4/2003 | Goto | G09G 3/3688 | 345/98 |
| 8,139,019 B2 * | 3/2012 | Han | H05B 41/3927 | 345/204 |
| 8,174,470 B2 * | 5/2012 | Ahn | G09G 3/3655 | 345/98 |
| 2002/0008686 A1 | 1/2002 | Kumada | G09G 3/3655 | 345/94 |
| 2005/0093958 A1 * | 5/2005 | Mori | G09G 3/3275 | 345/204 |
| 2005/0122321 A1 * | 6/2005 | Akai | G09G 3/3688 | 345/204 |
| 2005/0180083 A1 * | 8/2005 | Takahara | H01L 27/3223 | 361/152 |
| 2005/0195145 A1 * | 9/2005 | Maki | G09G 3/3688 | 345/89 |
| 2007/0001939 A1 * | 1/2007 | Hashimoto | G09G 3/3283 | 345/76 |
| 2007/0035487 A1 * | 2/2007 | Ryu | G09G 3/3233 | 345/76 |
| 2007/0080905 A1 * | 4/2007 | Takahara | G09G 3/3258 | 345/76 |
| 2007/0126667 A1 * | 6/2007 | Nakamura | G09G 3/325 | 345/76 |
| 2008/0074362 A1 * | 3/2008 | Ogura | G09G 3/3275 | 345/77 |
| 2008/0074413 A1 * | 3/2008 | Ogura | G09G 3/3233 | 345/82 |
| 2008/0165109 A1 | 7/2008 | Joo et al. | | |
| 2008/0284929 A1 * | 11/2008 | Kimura | G02F 1/1368 | 349/48 |
| 2009/0091520 A1 * | 4/2009 | Chiou | G09G 3/3241 | 345/77 |
| 2010/0177081 A1 * | 7/2010 | Lee | G09G 3/20 | 345/211 |
| 2010/0271102 A1 * | 10/2010 | Azetsuji | H03K 19/00361 | 327/306 |
| 2014/0239846 A1 * | 8/2014 | Shoji | H05B 45/60 | 315/297 |
| 2014/0285406 A1 * | 9/2014 | Kimura | G09G 3/3291 | 345/76 |
| 2014/0285537 A1 * | 9/2014 | Kimura | G09G 3/3291 | 345/77 |
| 2015/0248856 A1 * | 9/2015 | Kishi | G09G 3/3208 | 345/212 |
| 2016/0078837 A1 * | 3/2016 | Hong | G09G 3/3688 | 345/94 |
| 2016/0163266 A1 * | 6/2016 | Lee | G09G 3/3233 | 345/694 |
| 2016/0293097 A1 * | 10/2016 | Momoeda | G09G 3/2096 | |
| 2017/0011702 A1 * | 1/2017 | Yamagishi | G09G 3/3696 | |
| 2018/0174507 A1 * | 6/2018 | Ohara | H01L 51/50 | |
| 2018/0190208 A1 * | 7/2018 | Kimura | G09G 3/3291 | |

FOREIGN PATENT DOCUMENTS

| | | |
|---|---|---|
| CN | 1643564 A | 7/2005 |
| CN | 101231822 A | 7/2008 |
| CN | 101281720 A | 10/2008 |
| CN | 101783863 A | 7/2010 |
| CN | 102314839 A | 1/2012 |
| CN | 104064137 A | 9/2014 |
| CN | 104064138 A | 9/2014 |
| JP | 10-049110 A | 2/1998 |
| JP | 10-254412 A | 9/1998 |
| JP | 2001265291 A | 9/2001 |
| JP | 2003-195815 A | 7/2003 |
| JP | 2003-233355 A | 8/2003 |
| JP | 2004-096702 A | 3/2004 |
| JP | 2005-502093 A | 1/2005 |
| JP | 2007-240788 A | 9/2007 |
| JP | 2011-004390 A | 1/2011 |

OTHER PUBLICATIONS

Chinese Notice of Allowance dated Jan. 6, 2022 for corresponding Chinese Application No. 20170011722.9.

* cited by examiner

SOURCE DRIVER, DISPLAY APPARATUS, AND ELECTRONIC APPARATUS

TECHNICAL FIELD

The present disclosure relates to a source driver, a display apparatus, and an electronic apparatus.

BACKGROUND ART

In display apparatuses including display units such as electroluminescence display panels or liquid crystal display panels, in order to display images, a source driver that supplies to data lines a voltage corresponding to a gradation value supplied as a digital signal is used. For example, as disclosed in Japanese Patent Application Laid-open No. 2003-233355 (Patent Literature 1) or the like, there is known a source driver configured to appropriately select a voltage corresponding to a value of a gradation signal from a plurality of reference voltages and voltages obtained by dividing a reference voltage with a resistor circuit including a ladder resistor (gamma resistor) or the like, and further amplify the voltage with an amplifier circuit having a high drive capability, to drive data lines.

CITATION LIST

Patent Literature

Patent Literature 1: Japanese Patent Application Laid-open No. 2003-233355

DISCLOSURE OF INVENTION

Technical Problem

The source driver having the above-mentioned configuration includes a logic circuit such as a shift register unit that processes a video signal supplied as low voltage digital data having a crest value of, for example, approximately 1.5 volts, a level shifter unit that raises the output of the logic circuit and supplies it to a D/A converter circuit, an amplifier circuit that converts an output impedance of the D/A converter circuit and drives data lines, and the like.

In this case, circuits subsequent to the level shifter unit need to treat relatively high voltages, for example, approximately 10 volts to 20 volts. For that reason, in contrast to the shift register unit that processes a video signal supplied as low voltage digital data, the circuits subsequent to the level shifter unit need to be configured by using transistors having relatively high withstand voltages. As a result, it is necessary to set the element size to be large, and thus a circuit area is increased, which enlarges the frame portion of the display apparatus. Further, the power consumed along the operation of the amplifier circuit that drives the data lines becomes a factor that inhibits reduction in power consumption of the display apparatus.

Therefore, it is an object of the present disclosure to provide a source driver capable of reducing a circuit area by lowering the percentage of the transistors having a large element size and capable of achieving reduction in power consumption, a display apparatus using such a source driver, and an electronic apparatus including such a display apparatus.

Solution to Problem

A source driver according to a first aspect of the present disclosure so as to achieve the object described above is a source driver, which is used for supplying a voltage corresponding to a gradation value of a video signal to a data line of a display unit, the source driver including: a resistor having an end to which a predetermined power supply voltage is applied; and a current source that is connected to another end of the resistor, the amount of current of the current source being controlled according to the gradation value of the video signal, the voltage corresponding to the gradation value of the video signal being supplied from the other end of the resistor.

A display apparatus according to the first aspect of the present disclosure so as to achieve the object described above is a display apparatus including: a display unit; and a source driver that is used for supplying a voltage corresponding to a gradation value of a video signal to a data line of the display unit, the source driver including a resistor having an end to which a predetermined power supply voltage is applied, and a current source that is connected to another end of the resistor, the amount of current of the current source being controlled according to the gradation value of the video signal, the voltage corresponding to the gradation value of the video signal being supplied from the other end of the resistor to the data line.

An electronic apparatus according to the first aspect of the present disclosure so as to achieve the object described above is an electronic apparatus including a display apparatus that includes a display unit, and a source driver that is used for supplying a voltage corresponding to a gradation value of a video signal to a data line of the display unit, the source driver including a resistor having an end to which a predetermined power supply voltage is applied, and a current source that is connected to another end of the resistor, the amount of current of the current source being controlled according to the gradation value of the video signal, the voltage corresponding to the gradation value of the video signal being supplied from the other end of the resistor to the data line.

Advantageous Effects of Invention

According to the source driver of the present disclosure, the amount of current flowing in the resistor having an end to which a predetermined power supply voltage is applied is controlled, and thus a voltage corresponding to the gradation value of the video signal is supplied from the other end of the resistor to the data line. Since the current source can be controlled by a relatively low voltage, a circuit area of the source driver can be reduced. Further, an amplifier circuit that converts impedance and drives the data line becomes unnecessary, and reduction in power consumption can also be achieved. According to the display apparatus and the electronic apparatus of the present disclosure, the frame portion can be narrowed and the reduction in power consumption can also be achieved. Further, the effects disclosed herein are merely exemplary ones and are not restrictive ones, and additional effects may be produced.

BRIEF DESCRIPTION OF DRAWINGS

FIG. 3 is a schematic circuit diagram for describing a configuration of a source driver shown in FIG. 1 and the like.

FIG. 5 is a schematic circuit diagram for describing a configuration of a source driver of a reference example and the like.

FIG. 8 is a schematic circuit diagram for describing a configuration of a source driver used in a display apparatus of a second embodiment and the like.

FIG. 10 is a schematic circuit diagram for describing a configuration of a source driver used in a display apparatus of a third embodiment and the like.

FIG. 11 is a schematic circuit diagram for describing a configuration of a source driver used in a display apparatus of a fourth embodiment and the like.

FIG. 13 is a schematic circuit diagram for describing a configuration of a source driver used in a display apparatus of a fifth embodiment and the like.

FIG. 15 is an outer appearance view of a digital still camera of a lens-interchangeable and single-lens-reflex type, in which

MODE(S) FOR CARRYING OUT THE INVENTION

Figure 1:
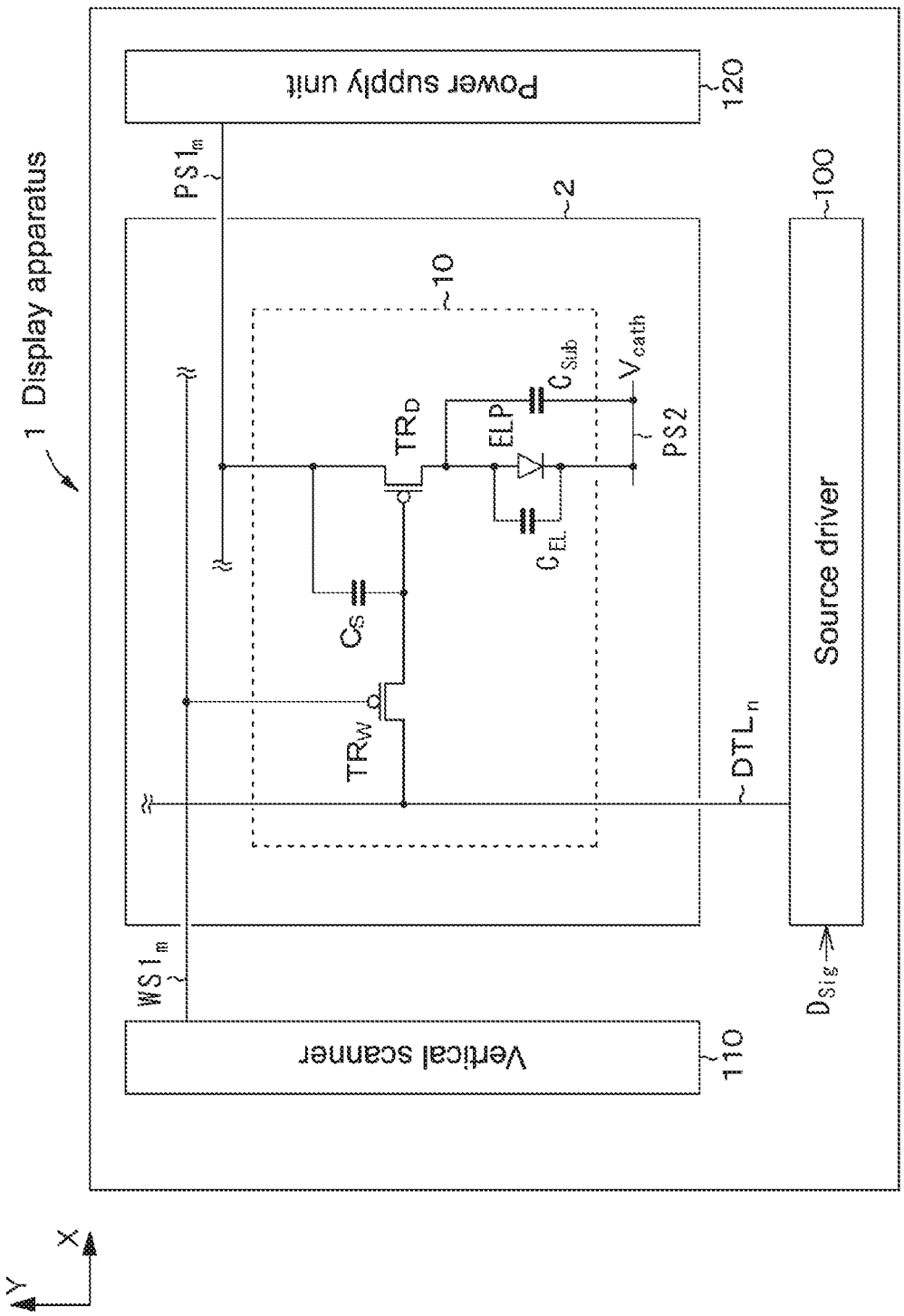
FIG. 1 is a conceptual diagram of a display apparatus according to a first embodiment.

Hereinafter, the present disclosure will be described on the basis of embodiments with reference to the drawings. The present disclosure is not limited to the embodiments, and various numerical values or materials in the embodiments are examples. In the following description, the same elements or elements having the same function are denoted by the same reference symbols, and overlapping description will be omitted. Note that the description will be given in the following order.

1. General description regarding source driver, display apparatus, and electronic apparatus according to present disclosure
2. First Embodiment
3. Second Embodiment
4. Third Embodiment
5. Fourth Embodiment
6. Fifth Embodiment
7. Description of electronic apparatus and others

[General Description Regarding Source Driver, Display Apparatus, and Electronic Apparatus According to Present Disclosure]

In a source driver according to a first aspect of the present disclosure, a source driver used in a display apparatus according to the first aspect of the present disclosure, and a source driver used in an electronic apparatus according to the first aspect of the present disclosure (hereinafter, simply referred to as source driver according to the first aspect of the present disclosure in some cases), another end of a resistor and a current source can be connected to each other via a data line, or a connection point of the other end of the resistor and the current source can be connected to the data line.

In the source driver according to the first aspect of the present disclosure including various favorable configurations described above, the amount of current of the current source can be controlled by an output voltage of a D/A converter unit that outputs the voltage corresponding to the gradation value of the video signal.

In this case, the source driver can further include a selector circuit that causes a plurality of current sources to correspond to a single output unit of the D/A converter unit. In this case, each of the plurality of current sources can include a capacitor unit that holds a voltage supplied from the D/A converter unit.

The number of current sources caused to correspond to the single output unit of the D/A converter unit is not particularly limited and may be set appropriately according to the specifications of the source driver or the like. For example, in color display using sets of the pixels of a red-color display element, a blue-color display element, and a green-color display element, a configuration to cause three current sources to correspond to the single output unit of the D/A converter unit, or a configuration to cause 3*3 current sources to correspond to the same can be exemplified.

In the source driver according to the first aspect of the present disclosure including various favorable configurations described above, the current source can include a transistor.

In this case, the current source can include a field-effect transistor and further include a correction circuit that corrects variations in characteristics of the field-effect transistor.

In this case, the correction circuit can perform correction corresponding to a value of a threshold voltage of the field-effect transistor. In this case, the correction circuit can cause the capacitor unit to hold a voltage that is corrected according to the value of the threshold voltage of the field-effect transistor, the capacitor unit being connected between a gate and a source of the field-effect transistor.

In the display apparatus according to the first aspect of the present disclosure, the display unit can include a display element that is configured to provide a blacker display as a voltage supplied to the data line approaches a predetermined power supply voltage. In this case, the display element can at least include a current-driven light-emitting unit, a storage capacitor that holds a voltage supplied from the data line, and a drive transistor that provides a current corresponding to the voltage held by the storage capacitor to the light-emitting unit.

Hereinafter, the source driver, the display apparatus, and the electronic apparatus according to the first aspect of the present disclosure are simply referred to as the present disclosure in some cases.

The source driver may have a configuration in which the constituent parts are integrated to be one or are configured as separate parts appropriately. Those parts can be configured by using well-known circuit elements. For example, a vertical scanner or a power supply unit shown in FIG. 1 can also be configured by using well-known circuit elements.

A well-known display unit such as a liquid crystal display unit or an electroluminescence display unit can be exemplified as a display unit used in the display apparatus of the present disclosure. The configuration of the display unit is not particularly limited as long as there is no trouble in the operation of the display apparatus.

In use application where reduction in size is requested, such as a display unit for a head mounted display or viewfinder, it is desirable to provide a configuration in which the display unit and the source driver are formed on the same substrate.

The display unit may have a so-called monochrome display configuration or may have a color display configuration. In the case of the color display configuration, a single pixel can have a configuration including a plurality of sub-pixels, i.e., a single pixel can have a configuration including a set of a red-color display element, a green-color display element, and a blue-color display element. Furthermore, a single pixel can also have a configuration including a set of those three display elements and one or more types of display elements.

Examples of pixel values of the display unit include, in addition to U-XGA (1600, 1200), HD-TV (1920, 1080), and Q-XGA (2048, 1536), some of image display resolutions such as (3840, 2160) and (7680, 4320), but the present disclosure is not limited to those values.

Various conditions in this specification are satisfied when mathematically precisely established and also substantially established. The presence of variations generated in the design or production is permitted.

In a timing chart used in the following description, the length (time length) of the horizontal axis representing each period is schematic and does not represent the percentage of the time length of each period. The same holds true for the vertical axis. Further, the shape of waveforms in the timing chart is also schematic.

FIRST EMBODIMENT

The first embodiment relates to a source driver and a display apparatus according to the first aspect of the present disclosure.

FIG. 1 is a conceptual diagram of a display apparatus according to a first embodiment. A display apparatus 1 includes a display unit 2 and a source driver 100. The display unit 2 includes display elements 10 arrayed in a two-dimensional matrix while being connected to scanning lines WS1 extending in a row direction (in FIG. 1, X direction) and to data lines DTL extending in a column direction (in FIG. 1, Y direction). The source driver 100 applies a voltage to the data lines DTL. A scanning signal is supplied from a vertical scanner 110 to the scanning lines WS1. Note that, for convenience of illustration, FIG. 1 shows a wiring relationship regarding a single display element 10, more specifically, a (n, m)-th display element 10 to be described later.

The display unit 2 further includes feeder lines PS1 connected to the display elements 10 arranged in the row direction and a common feeder line PS2 connected commonly to all the display elements 10. A predetermined drive voltage is supplied from a power supply unit 120 to the feeder lines PS1 so as to correspond to the scanning of the scanning lines WS1. Meanwhile, a common voltage $V_{cath}$ (e.g., ground potential) is constantly supplied to the common feeder line PS2.

Although not shown in FIG. 1, a region where the display unit 2 displays an image (display region) includes the N display elements 10 in the row direction by the M display elements 10 in the column direction, a total of N*M display elements 10 arrayed in a two-dimensional matrix. The number of rows of the display elements 10 in the display region is M, and the number of display elements 10 forming each row is N.

Further, the number of scanning lines WS1 and the number of feeder lines PS1 are each M. The display elements 10 in the m-th row (where m=1, 2, . . . , M) are connected to the m-th scanning line $WS1_m$ and the m-th feeder line $PS1_m$ and form a single display element row. Note that FIG. 1 shows only the feeder line $PS1_m$.

Further, the number of data lines DTL is N. The display elements 10 in the n-th column (where n=1, 2, . . . , N) are connected to the n-th data line $DTL_n$. Note that FIG. 1 shows only the data line $DTL_n$.

The display apparatus 1 is, for example, a display apparatus for monochrome display, in which a single display element 10 forms a single pixel. The display apparatus 1 is line-sequentially scanned on a row-by-row basis by the scanning signal from the vertical scanner 110. The display element 10 positioned in the m-th row and the n-th column is hereinafter referred to as the (n, m)-th display element 10 or the (n, m)-th pixel.

In the display apparatus 1, the display elements 10 forming the respective N pixels arrayed in the m-th row are simultaneously driven. In other words, in the N display elements 10 arranged along the row direction, a light emitting/non-light emitting timing thereof is controlled for each row to which those N display elements 10 belong. Assuming that a display frame rate of the display apparatus 1 is represented by FR (number of times/seconds), a scanning interval (so-called horizontal scanning interval) per row when the display apparatus 1 is line-sequentially scanned on a row-by-row basis is less than (1/FR)*(1/M) seconds.

To the source driver 100, a video signal $D_{Sig}$ representing a gradation corresponding to an image to be displayed is input from, for example, an apparatus that is not shown in the figure. The video signal $D_{Sig}$ is a low voltage digital signal having a crest value of, for example, approximately 1.5 volts. The source driver 100 of the display apparatus 1 is a source driver used for supplying a voltage corresponding to a gradation value of the video signal $D_{Sig}$ to the data lines DTL of the display unit 2.

Among the input video signals $D_{Sig}$, a signal corresponding to the (n, m)-th display element 10 is represented by $D_{Sig(n,m)}$. In the following description, a gradation bit number of the video signal $D_{Sig}$ is assumed to be 8 bits, but the gradation bit number is not limited thereto. For example, a configuration having a bit number such as 12 bits, 16 bits, or 24 bits may be employed.

The source driver 100 generates an analog signal corresponding to the gradation value of the video signal $D_{Sig}$ and supplies the resultant signal to the data lines DTL. The analog signal to be generated is a signal having a crest value of, for example, approximately 10 volts to 20 volts, which is a high voltage with respect to the video signal $D_{Sig}$.

The display element 10 disposed on the display unit 2 is a display element configured to provide a blacker display as a voltage supplied to the data lines DTL approaches a predetermined power supply voltage $V_{DD}$ (e.g., 15 volts). The display element 10 at least includes a current-driven light-emitting unit ELP, a storage capacitor $C_S$ that holds the voltage supplied from the data lines DTL, a drive transistor $TR_D$ that provides a current corresponding to the voltage held by the storage capacitor $C_S$ to the light-emitting unit ELP, and further includes a write transistor $TR_W$.

The light-emitting unit ELP is a current-driven electro-optic element whose light emission luminance changes according to the value of a flowing current. Specifically, the light-emitting unit ELP is formed of an organic electroluminescence element. The light-emitting unit ELP has a well-known configuration or structure including an anode electrode, a hole transport layer, a light-emitting layer, an electron transport layer, a cathode electrode, and the like.

Each transistor of the display element 10 may be formed of, for example, a semiconductor thin-film formed on a substrate made of glass or the like, or may be provided on a silicon semiconductor substrate. In the first embodiment, each transistor of the display element 10 is formed of a p-channel field-effect transistor.

The storage capacitor $C_S$ is used for holding a voltage of a gate electrode to a source region of the drive transistor $TR_D$ (i.e., gate-source voltage). In a light-emitting state of the display element 10, one source/drain region of the drive transistor $TR_D$ (in FIG. 1, the side connected to the feeder line PS1) works as a source region, and the other source/drain region thereof works as a drain region. One electrode and the other electrode of the storage capacitor $C_S$ are each connected to the one source/drain region and the gate electrode of the drive transistor $TR_D$. The other source/drain region of the drive transistor $TR_D$ is connected to the anode electrode of the light-emitting unit ELP.

The write transistor $TR_W$ includes a gate electrode connected to the scanning line WS1, one source/drain region connected to the data line DTL, and the other source/drain region connected to the gate electrode of the drive transistor $TR_D$.

The other end of the light-emitting unit ELP (specifically, cathode electrode) is connected to the common feeder line PS2. A predetermined voltage $V_{cath}$ is supplied to the common feeder line PS2. Note that a capacitor of the light-emitting unit ELP is represented by a reference symbol $C_{EL}$. In a case where the capacitor $C_{EL}$ of the light-emitting unit ELP is small and thus a trouble occurs when the display element 10 is driven, an auxiliary capacitor $C_{Sub}$ connected in parallel with the light-emitting unit ELP may be provided as needed. An example in which the auxiliary capacitor $C_{Sub}$ is provided is shown in the figure, but it is merely an example.

In a state where a voltage corresponding to the luminance of an image to be displayed is supplied from the source driver 100 to the data lines DTL and when the write transistor $TR_W$ enters a conductive state by the scanning signal from the vertical scanner 110, a voltage corresponding to the gradation value of the image to be displayed is written in the storage capacitor $C_S$. After the write transistor $TR_W$ enters a non-conductive state, the current flows in the drive transistor $TR_D$ according to the voltage held in the storage capacitor $C_S$, and the light-emitting unit ELP emits light.

Figure 2:
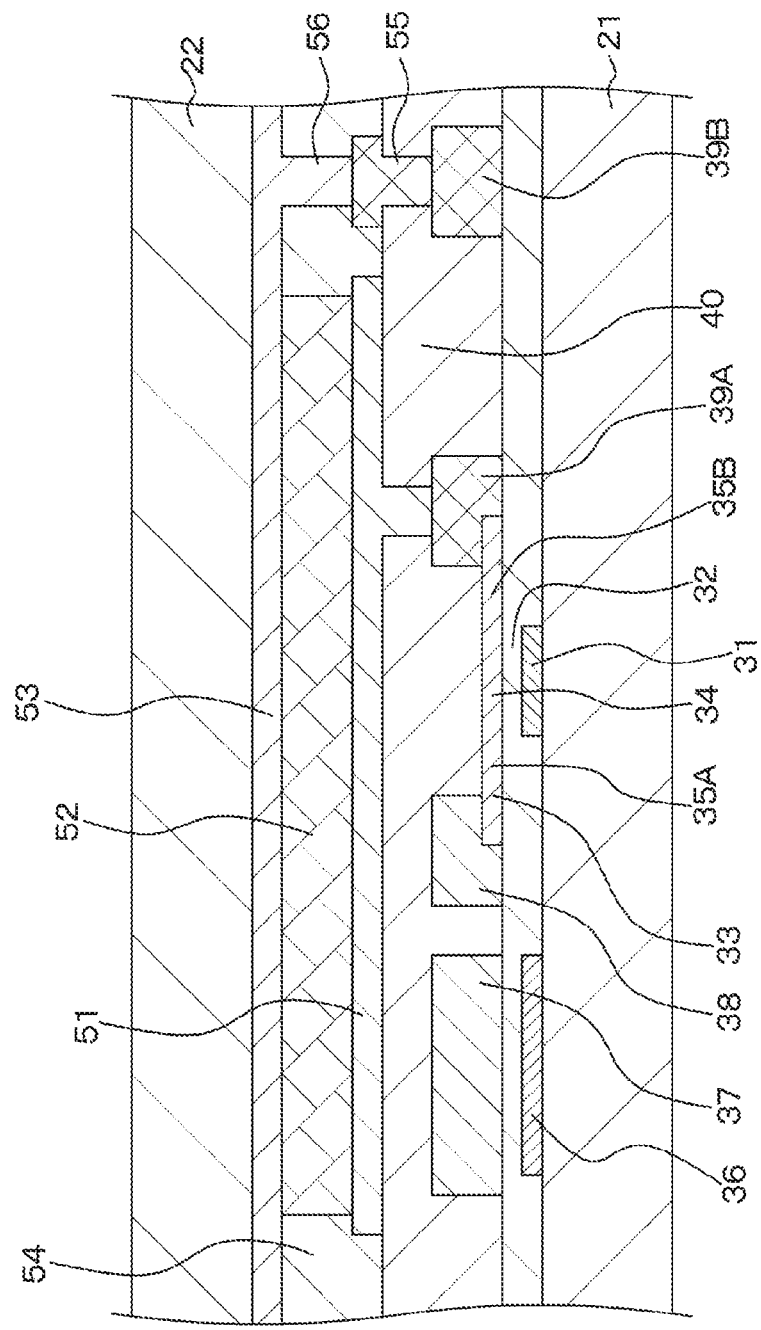
FIG. 2 is a schematic partial cross-sectional view of a part including a display element in a display unit.

Here, an arrangement relationship between the light-emitting unit ELP, the transistors, and the like will be described. FIG. 2 is a schematic partial cross-sectional view of a part including the display element in the display unit.

The transistors and the storage capacitor $C_S$ forming the display element 10 are formed on a support 21. The light-emitting unit ELP is formed on the upper side of them via an interlayer insulating layer 40. Further, the other source/drain region of the drive transistor $TR_D$ is connected via a contact hole to the anode electrode provided to the light-emitting unit ELP. Note that FIG. 2 shows the drive transistor $TR_D$ and the storage capacitor $C_S$. Other transistors and the like are hidden and not seen.

The drive transistor $TR_D$ includes a gate electrode 31, a gate insulating layer 32, one source/drain region 35A provided to a semiconductor layer 33, the other source/drain region 35B, and a channel forming region 34 that corresponds to the part of the semiconductor layer 33 between the one source/drain region 35A and the other source/drain region 35B. Meanwhile, the storage capacitor $C_S$ includes one electrode 36, a dielectric layer configured from the extending portion of the gate insulating layer 32, and the other electrode 37. The gate electrode 31, part of the gate insulating layer 32, and the one electrode 36 forming the storage capacitor $C_S$ are formed on the support 21. The one source/drain region 35A of the drive transistor $TR_D$ is connected to wiring 38 (corresponding to the feeder line PS1), and the other source/drain region 35B is connected via wiring 39A to an anode electrode 51 to be described later.

The drive transistor $TR_D$, the storage capacitor $C_S$, and the like are covered with the interlayer insulating layer 40. On the interlayer insulating layer 40, the light-emitting unit ELP including the anode electrode 51, a hole transport layer, a light-emitting layer, an electron transport layer, and a cathode electrode 53 is provided. Note that in the figure the hole transport layer, the light-emitting layer, and the electron transport layer are expressed as a single layer 52. A second interlayer insulating layer 54 is provided on a portion in which the light-emitting unit ELP is not provided on the interlayer insulating layer 40. A transparent substrate 22 is disposed on the second interlayer insulating layer 54 and the cathode electrode 53. Light emitted in the light-emitting layer passes through the substrate 22 and is emitted to the outside. Note that the wiring 39A and the anode electrode 51 are connected to each other via the contact hole provided to the interlayer insulating layer 40. Further, the cathode electrode 53 is connected to wiring 39B (corresponding to the common feeder line PS2 to which the voltage $V_{Cath}$ is supplied) provided on the extending portion of the gate insulating layer 32, via contact holes 56 and 55 that are respectively provided to the second interlayer insulating layer 54 and the interlayer insulating layer 40.

Figure 3:
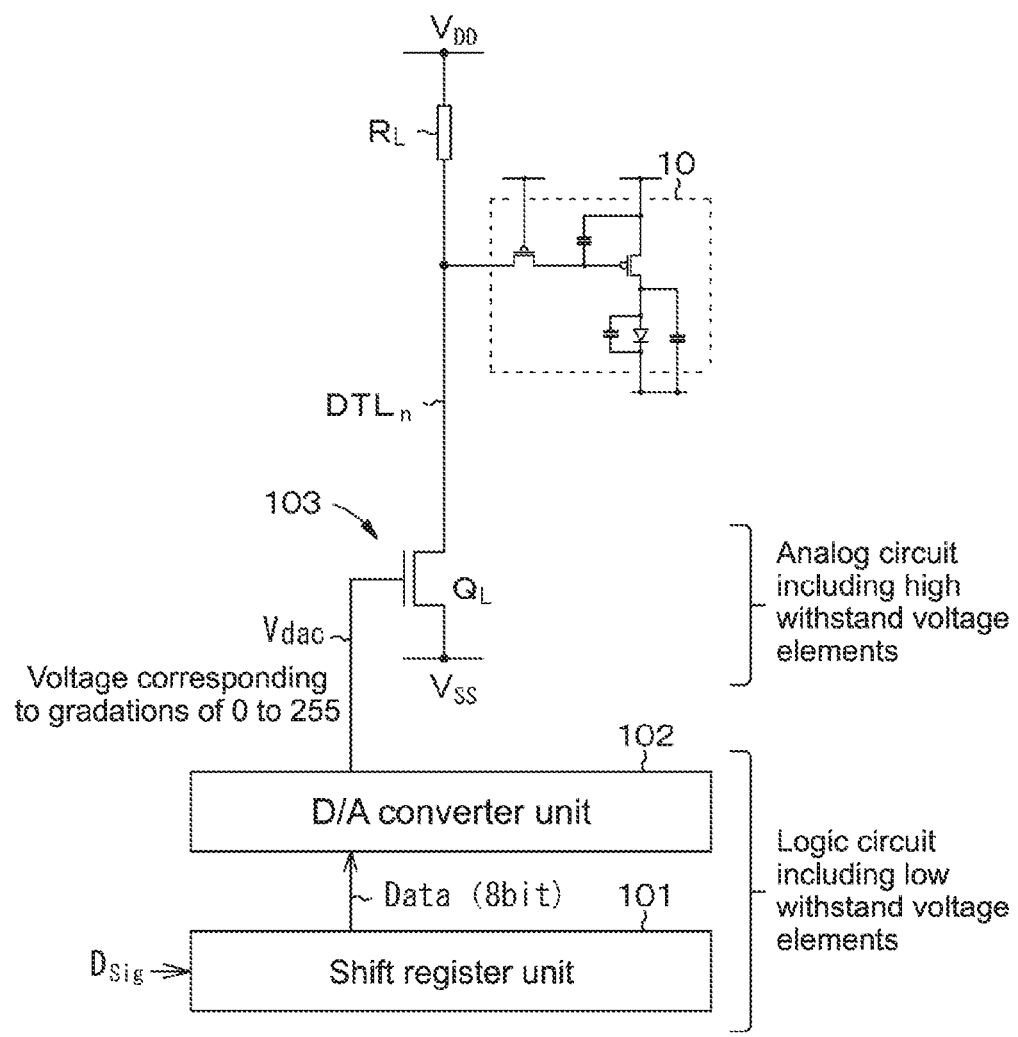

Next, the configuration of the source driver 100 will be described. FIG. 3 is a schematic circuit diagram for describing the configuration of the source driver shown in FIG. 1 and the like. Note that, for convenience of illustration, FIG. 3 shows a connection relationship regarding a single data line DTL.

The source driver 100 includes a resistor $R_L$, a predetermined power supply voltage $V_{DD}$ being applied to one end thereof, and a current source 103 that is connected to the other end of the resistor $R_L$. The amount of current of the current source 103 is controlled according to a gradation value of the video signal $D_{Sig}$. The source driver 100 further includes a shift register unit 101 that performs shift processing for the video signal $D_{Sig}$ as a low voltage digital signal, and a D/A converter unit 102 that generates a voltage corresponding to the gradation indicated by the video signal $D_{Sig}$. The current source 103 is formed of a transistor, more specifically, a field-effect transistor $Q_L$ whose source is connected (grounded) to a predetermined reference voltage $V_{SS}$.

Figure 4:
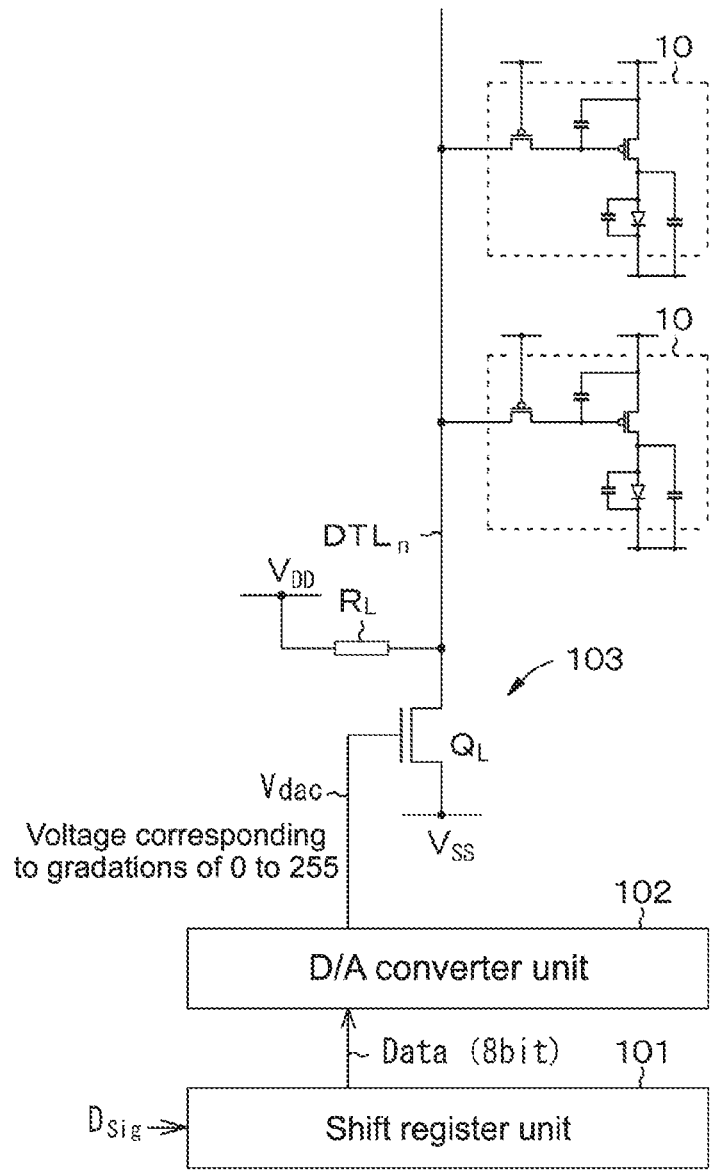
FIG. 4 is a schematic circuit diagram for describing another configuration example of the source driver.

In the example shown in FIG. 3, the other end of the resistor $R_L$ and the current source 103 are connected to each other via the data line DTL. Note that, as shown in FIG. 4, a configuration in which the data line DTL is connected to a connection point of the other end of the resistor $R_L$ and the current source 103 can also be provided.

In the source driver according to the first aspect of the present disclosure including the various favorable configurations described above, the amount of current of the current source is controlled by an output voltage of the D/A converter unit 102 that outputs a voltage corresponding to the gradation value of the video signal $D_{Sig}$. The voltage corresponding to the gradation value of the video signal $D_{Sig}$ is then supplied from the other end of the resistor $R_L$.

Here, in order to aid the reader's understanding of the present disclosure, a general configuration of a source driver of a reference example, in which amplification is performed by an amplifier circuit having a high drive capability and data lines are then driven, and problems thereof will be described.

Figure 5:
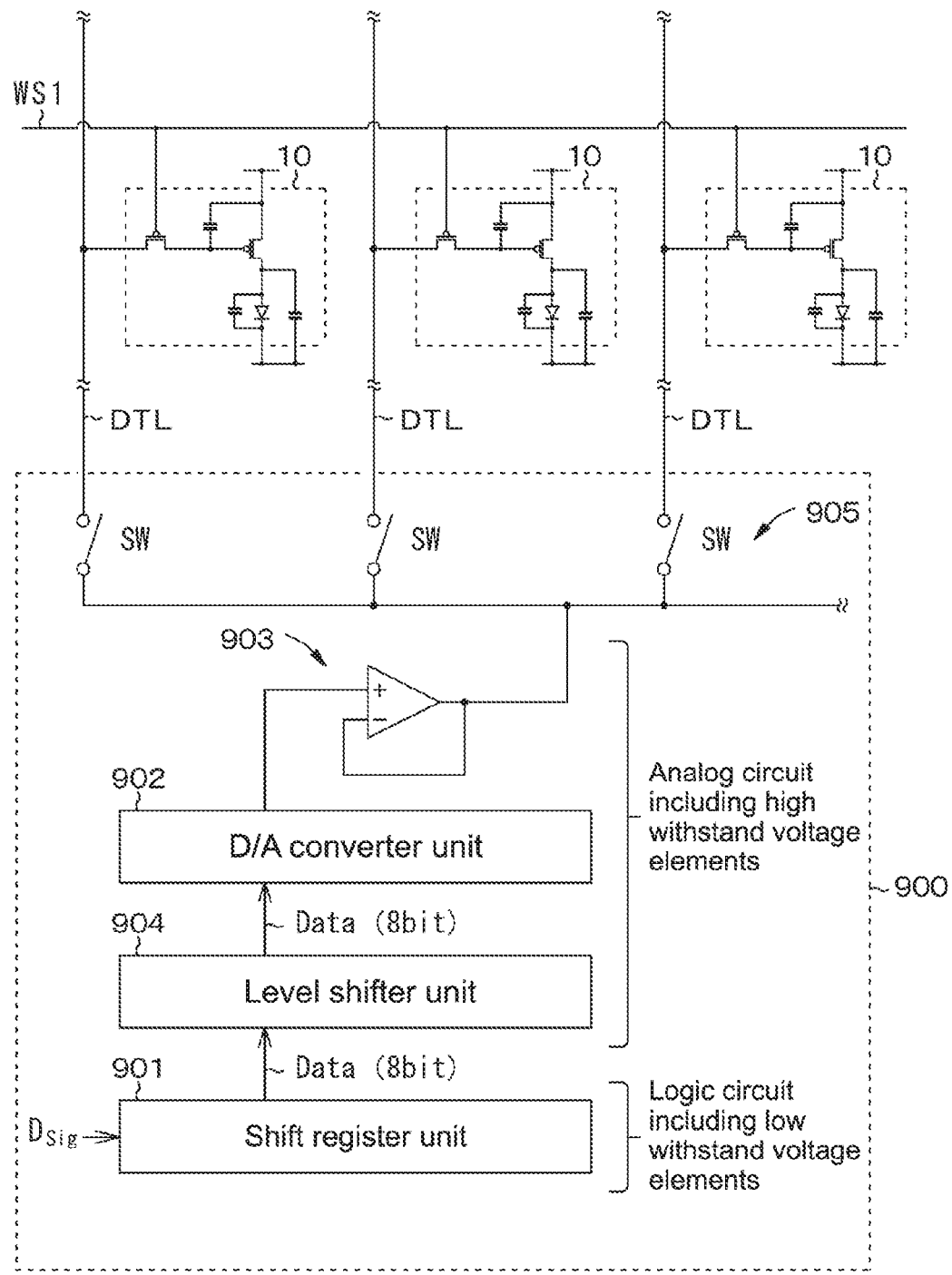

FIG. 5 is a schematic circuit diagram for describing a configuration of a source driver of a reference example and the like.

A source driver 900 of a reference example includes a shift register unit 901 that transfers the video signal $D_{sig}$, a level shifter unit 904 that increases the voltage of the video signal $D_{Sig}$, a D/A converter unit 902 that selects and outputs an analog voltage corresponding to the gradation of the video signal $D_{Sig}$ after the increase of the voltage, and a voltage follower amplifier 903 that performs impedance conversion on the output of the D/A converter unit 902 and charges/discharges the signal lines DTL. A selector circuit 905 is for causing the single voltage follower amplifier 903 to correspond to the plurality of data lines DTL.

In this case, the shift register unit 901 performs shift processing for the video signal $D_{Sig}$ as a low voltage digital signal. Therefore, elements such as transistors forming the shift register unit 901 can be formed of elements with a low withstand voltage. Further, a relatively low voltage suffices for a voltage supplied so as to operate the shift register unit 901. Thus, electric power consumed during the operation is also reduced.

Meanwhile, the level shifter unit 904 changes the crest value of the video signal $D_{Sig}$ to a voltage of, for example, approximately 10 volts to 20 volts, and supplies it to the D/A converter unit 902. Therefore, it is necessary to use elements having a relatively high withstand voltage for the elements such as the transistors forming those components. The same holds true for the voltage follower amplifier 903.

As a result, in the configuration shown in FIG. 5, it is necessary to configure the circuits subsequent to the level shifter unit 904 by using transistors having a high withstand voltage. For that reason, elements having a large element size are used, and a circuit area is increased. Further, it is necessary to set the power supply voltage supplied so as to operate the circuits forming them to be a relatively high voltage, and thus electric power consumed during the operation is increased, which becomes a bottleneck for the reduction in power consumption.

Figure 6:
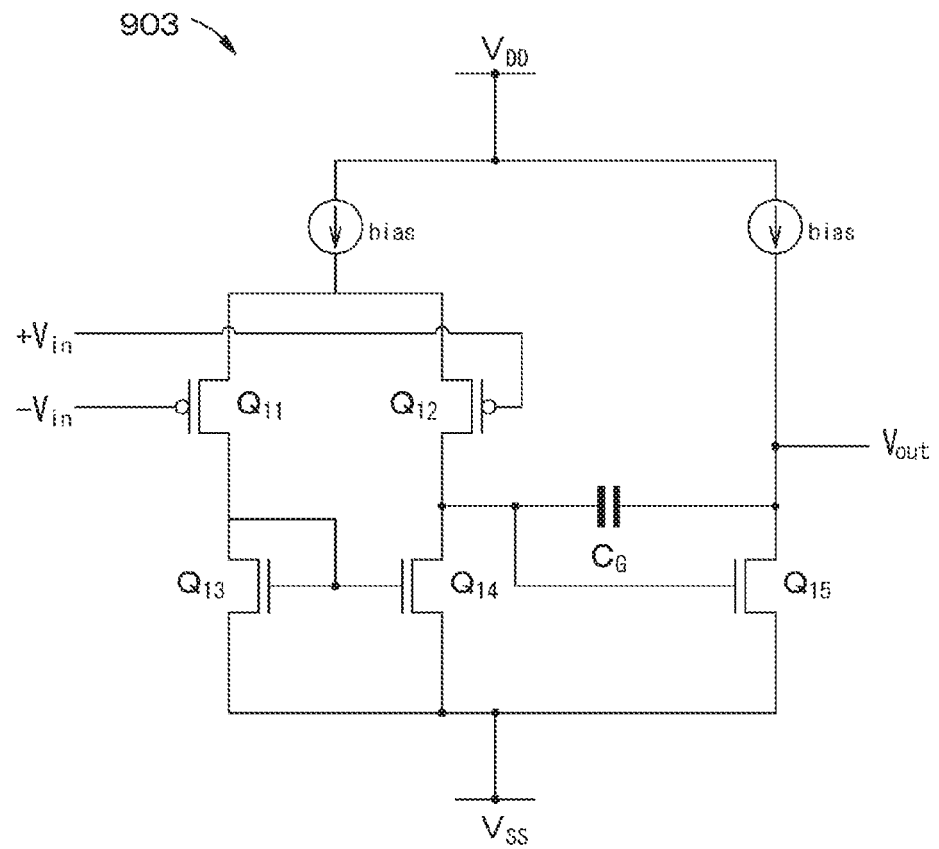
FIG. 6 is a schematic circuit diagram for describing a voltage follower amplifier used in the source driver of the reference example.

Furthermore, the voltage follower amplifier 903 needs to provide a constant bias current during the operation and constantly consumes electric power irrespective of the input signal value. FIG. 6 is a schematic circuit diagram for describing the voltage follower amplifier used in the source driver of the reference example.

The voltage follower amplifier 903 includes transistors $Q_{11}$ and $Q_{12}$ as a differential pair, transistors $Q_{13}$ and $Q_{14}$ forming a current mirror, an output transistor $Q_{15}$, and a capacitor $C_g$, and in addition thereto, a constant current circuit that provides a bias current, and the like. In such a manner, since the bias current is constantly provided irrespective of the input signal value, the electric power is constantly consumed.

Hereinafter, the general configuration and problems of the source driver of the reference example have been described. Subsequently, the source driver and the display apparatus according to the present disclosure will be described.

As shown in FIG. 3, the video signal $D_{Sig}$ as a low voltage digital signal is input to the D/A converter unit 102 forming the source driver according to the first embodiment via the shift register unit 101. Therefore, elements such as transistors forming the D/A converter unit 102 can be formed of elements with a low withstand voltage. Further, a relatively low voltage suffices for a voltage supplied so as to operate the D/A converter unit 102. Thus, electric power consumed during the operation is also reduced.

In such a manner, the video signal $D_{Sig}$ is input to the D/A converter unit 102 without increasing the voltage, and a current flowing in the current source 103 whose drain side is connected to the signal lines DTL is controlled by an output voltage $V_{dac}$ of the D/A converter unit 102. More specifically, the output voltage $V_{dac}$ is input to the gate of the current source formed by grounding the source of an n-channel field-effect transistor $Q_L$. If the voltage is set such that the field-effect transistor $Q_L$ operates in a saturated region, a flowing drain current $I_{ds}$ is represented by the following expression (1).

$$I_{ds} = k \cdot \mu \cdot (V_{gs\_QL} - V_{th\_QL})^2 \quad (1)$$
$$= k \cdot \mu \cdot ((V_{dac} - V_{SS}) - V_{th\_QL})^2$$

where
μ: effective mobility
L: channel length
W: channel width
$V_{gs\_QL}$: gate-source voltage of transistor $Q_L$
$V_{th\_QL}$: threshold voltage of transistor $Q_L$
$C_{ox}$: (relative dielectric constant of gate insulating layer)
*(dielectric constant of vacuum)/(thickness of gate insulating layer)

$$k=(½) \cdot (W/L) \cdot C_{ox}$$

are defined.

As described above, the other end of the resistor $R_L$, the predetermined power supply voltage $V_{DD}$ being applied to the one end thereof, and the current source 103 are connected to each other via the data lines DTL. Therefore, a voltage $V_{sig}$ supplied to the data lines DTL is represented by the following expression (2).

$$V_{sig} = V_{DD} - I_{ds} \cdot R_L \quad (2)$$

The resistor $R_L$ can have a high resistance value at which the parasitic resistance of the signal wiring is not problematic in actual use, and is desirably formed of a polysilicon resistor element that can be formed integrally in a semiconductor chip.

With the source driver according to the present disclosure, on the basis of the output voltage $V_{dac}$ having a small amplitude from the D/A converter unit 102, a voltage $V_{sig}$ obtained by reversing and amplifying the output voltage $V_{dac}$ can be generated.

Figure 7A:
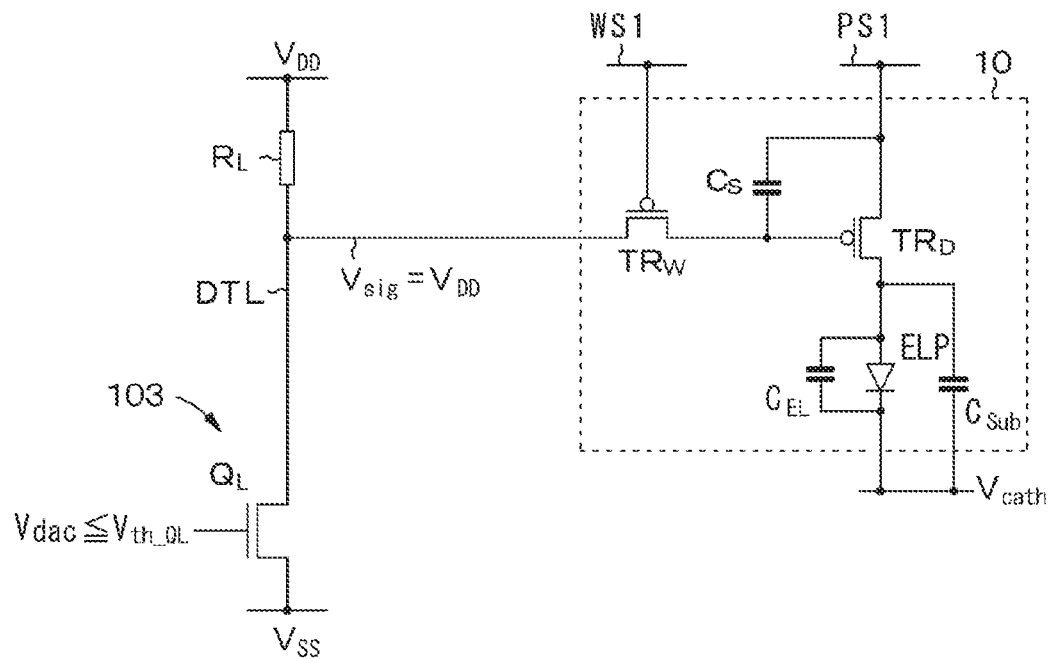
FIG. 7A is a schematic circuit diagram for describing an operation in a case where a voltage $V_{DD}$ is supplied as a voltage of a video signal.

In order to set the voltage $V_{sig}$ supplied to the data lines DTL to the voltage $V_{DD}$ in the configuration described above, the drain current $I_{ds}$ only needs to be set to "0". In other words, the following expression only needs to be satisfied: $V_{dac} \le V_{th\_QL}$, in such a manner that the transistor $Q_L$ forming the current source 103 is cut off. FIG. 7A shows this state. In this case, in order to set the voltage $V_{sig}$ to the voltage $V_{DD}$, a transitional current for charging the load capacitance of the signal lines DTL flows from the power supply circuit, but a constant current does not flow.

Figure 7B:
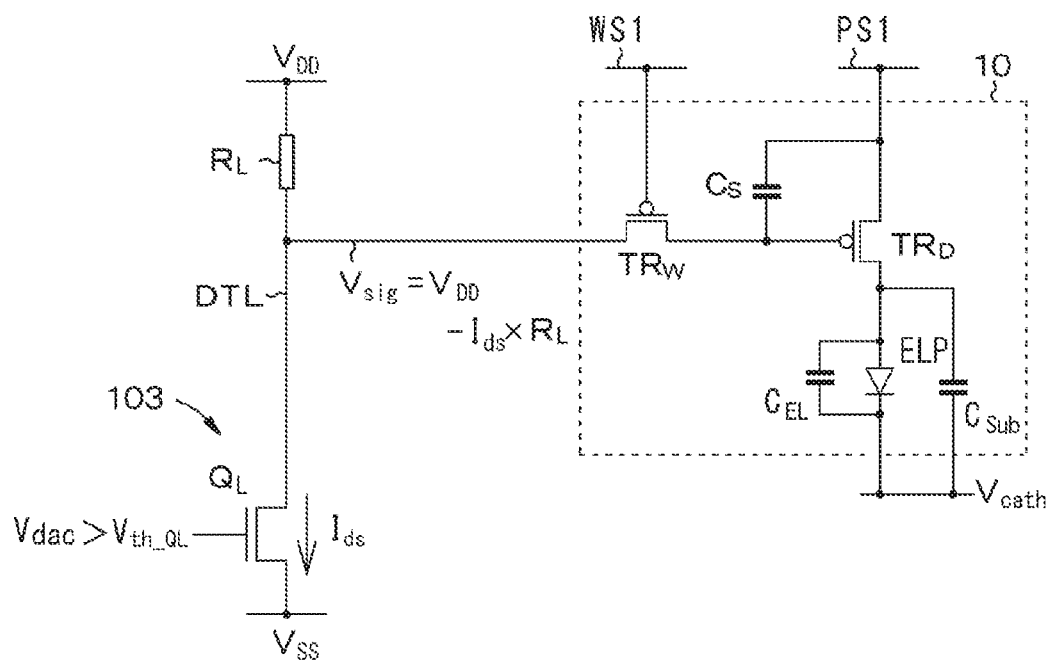
FIG. 7B is a schematic circuit diagram for describing an operation in a case where a voltage that has dropped by a current flowing in the resistor is supplied as a voltage of the video signal.

Further, in order to set the voltage $V_{sig}$ supplied to the data lines DTL to be lower than the voltage $V_{DD}$, the following expression only needs to be satisfied: $V_{dac} > V_{th\_QL}$. In this case, the voltage $V_{sig}$ is provided by the above-mentioned expression (2). FIG. 7B shows this state.

The display element 10 is a display element configured to provide a blacker display as a voltage supplied to the data lines DTL approaches a predetermined power supply voltage. The drive transistor $TR_D$ of the display element 10 is a p-channel field-effect transistor, and thus, for the black display, the voltage $V_{DD}$ is written such that the drive transistor $TR_D$ enters a non-conductive state.

In the black display state, a transitional current for charging the load capacitance of the signal lines DTL flows, but a constant current does not flow. Therefore, further reduction in power consumption can be achieved in a case where a video in which a black display is frequently performed is displayed. For example, a head mounted display of a see-through use application is used on the premise that display is performed in a state where the background can be observed. Therefore, a large part of the display unit 2 is displayed as black display. In such a use application, further reduction in power consumption can be achieved.

SECOND EMBODIMENT

The second embodiment also relates to a source driver and a display apparatus according to the first aspect of the present disclosure.

In a schematic view of a display apparatus 1A according to the second embodiment, it is only necessary to consider the display apparatus 1 as a display apparatus 1A and consider the source driver 100 as a source driver 100A in FIG. 1.

The D/A converter unit 102 shown in FIG. 3 includes many switching transistors. Therefore, a circuit area of the D/A converter unit 102 is larger than that of the current source 103. It is desirable to decrease the scale of the D/A converter unit 102 so as to decrease the frame area of the display apparatus.

In this regard, the source driver 100A of the second embodiment has a configuration including a selector circuit that causes a plurality of current sources to correspond to a single output unit of the D/A converter unit. Each of the current sources includes a capacitor unit that holds a voltage supplied from the D/A converter unit. This can achieve the reduction in circuit scale of the D/A converter unit.

Figure 8:
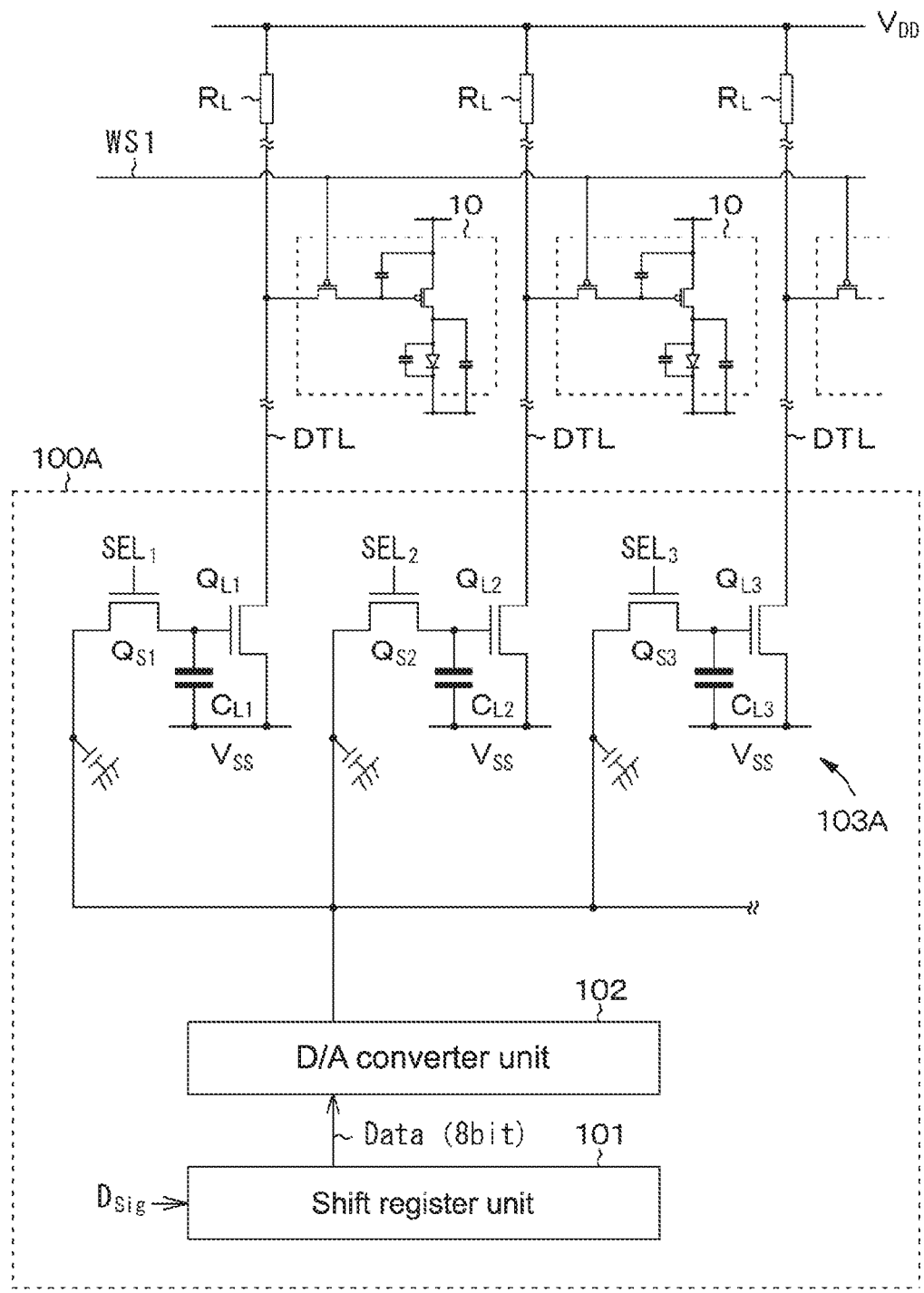

FIG. 8 is a schematic circuit diagram for describing a configuration of a source driver used in a display apparatus of the second embodiment and the like.

As shown in FIG. 8, in the source driver 100A, a plurality of (in the figure, three) current sources 103A and a single output unit of the D/A converter unit 102 are caused to correspond to each other. N-channel field-effect transistors $Q_{L1}$, $Q_{L2}$, and $Q_{L3}$ of the current sources 103A respectively include capacitor units $C_{L1}$, $C_{L2}$, and $C_{L3}$ for holding a gate-source voltage.

The selector circuit includes transistors $Q_{S1}$, $Q_{S2}$, and $Q_{S3}$, and the conductive state/non-conductive state thereof is respectively controlled by signals of control lines $SEL_1$, $SEL_2$, and $SEL_3$.

Figure 9:
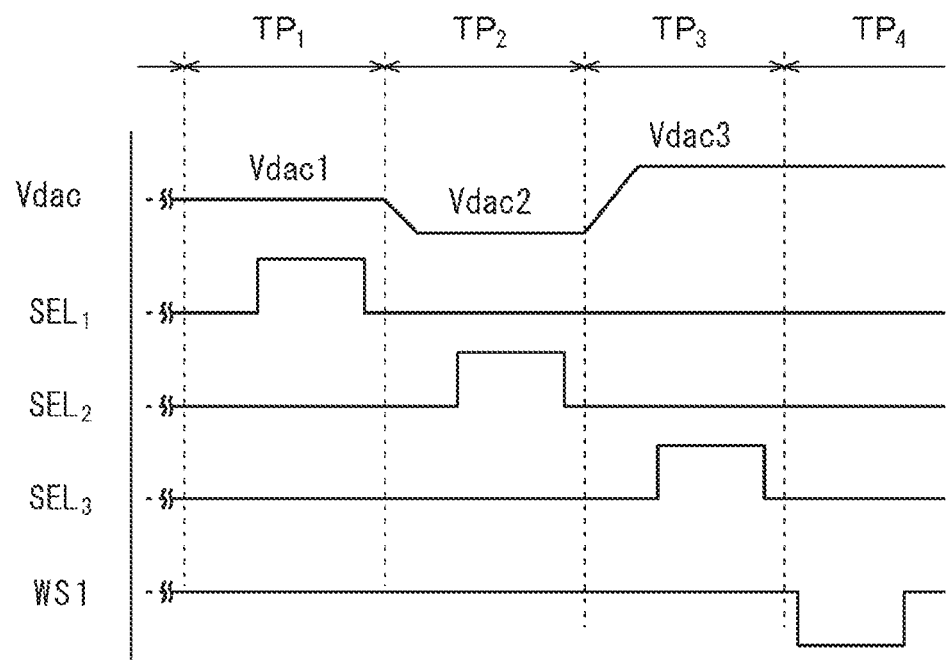
FIG. 9 is a schematic graph for describing an operation of the source driver shown in FIG. 8.

The operation of the source driver of the second embodiment will be described with reference to FIG. 9. From a period $TP_1$ to a period $TP_3$, voltages $V_{dac1}$, $V_{dac2}$, and $V_{dac3}$ to be held in the capacitor units $C_{L1}$, $C_{L2}$, and $C_{L3}$, respectively, are sequentially output from the D/A converter unit 102. In synchronization with this, pulses are then supplied sequentially from the control lines $SEL_1$, $SEL_2$, and $SEL_3$. Thus, the voltages $V_{dac1}$, $V_{dac2}$, and $V_{dac3}$ are respectively written in the capacitor units $C_{L1}$, $C_{L2}$, and $C_{L3}$. The voltage $V_{sig}$ shown in the above-mentioned expression (2) is supplied to each of the data lines DTL on the basis of the current flowing in the transistors $Q_{S1}$, $Q_{S2}$, and $Q_{S3}$. Subsequently, in a period $TP_4$, a write pulse is supplied from the vertical scanner 110 to the scanning line WS1, and the voltage $V_{sig}$ is written in the storage capacitor $C_s$ of the display element 10.

THIRD EMBODIMENT

The third embodiment also relates to a source driver and a display apparatus according to the first aspect of the present disclosure. The third embodiment is a modification of the second embodiment.

In a schematic view of a display apparatus 1B according to the third embodiment, it is only necessary to consider the display apparatus 1 as a display apparatus 1B and consider the source driver 100 as a source driver 100B in FIG. 1.

In the second embodiment, the single output unit of the D/A converter unit 102 and the transistors $Q_{S1}$, $Q_{S2}$, and $Q_{S3}$ forming the selector are constantly connected to each other by wiring. Therefore, the output load of the D/A converter unit 102 is large.

In contrast to this, in the third embodiment, switches $SW_1$, $SW_2$, and $SW_3$ for selecting columns are further disposed between the single output unit of the D/A converter unit 102 and the transistors $Q_{S1}$, $Q_{S2}$, and $Q_{S3}$ forming the selector. With those switches, the voltage $V_{dac}$ is written in each column in a time-division manner and then written in a lump by a control line WP1 connected to the gate of the current source.

FOURTH EMBODIMENT

The fourth embodiment also relates to a source driver and a display apparatus according to the first aspect of the present disclosure.

Regarding the transistors $Q_L$ forming the current sources that have been described in the first to third embodiments, it is unavoidable for a threshold voltage $V_{th\_QL}$ to vary between the transistors $Q_L$. Therefore, even if the voltage $V_{dac}$ is the same, the value of the drain current $I_{ds}$ shown in the above-mentioned expression (1) has variations. Thus, it is conceivable that random vertical stripes are visually recognized on the display unit 2.

In the fourth embodiment, the current source includes a field-effect transistor and further includes a correction circuit that corrects variations in characteristics of the field-effect transistor. The correction circuit performs correction corresponding to the value of a threshold voltage of the field-effect transistor. More specifically, the correction circuit causes the capacitor unit, which is connected between the gate and the source of the field-effect transistor, to hold a voltage corrected according to the value of the threshold voltage of the field-effect transistor.

In a schematic view of a display apparatus 1C according to the fourth embodiment, it is only necessary to consider the display apparatus 1 as a display apparatus 1C and consider the source driver 100 as a source driver 100C in FIG. 1.

Figure 10:
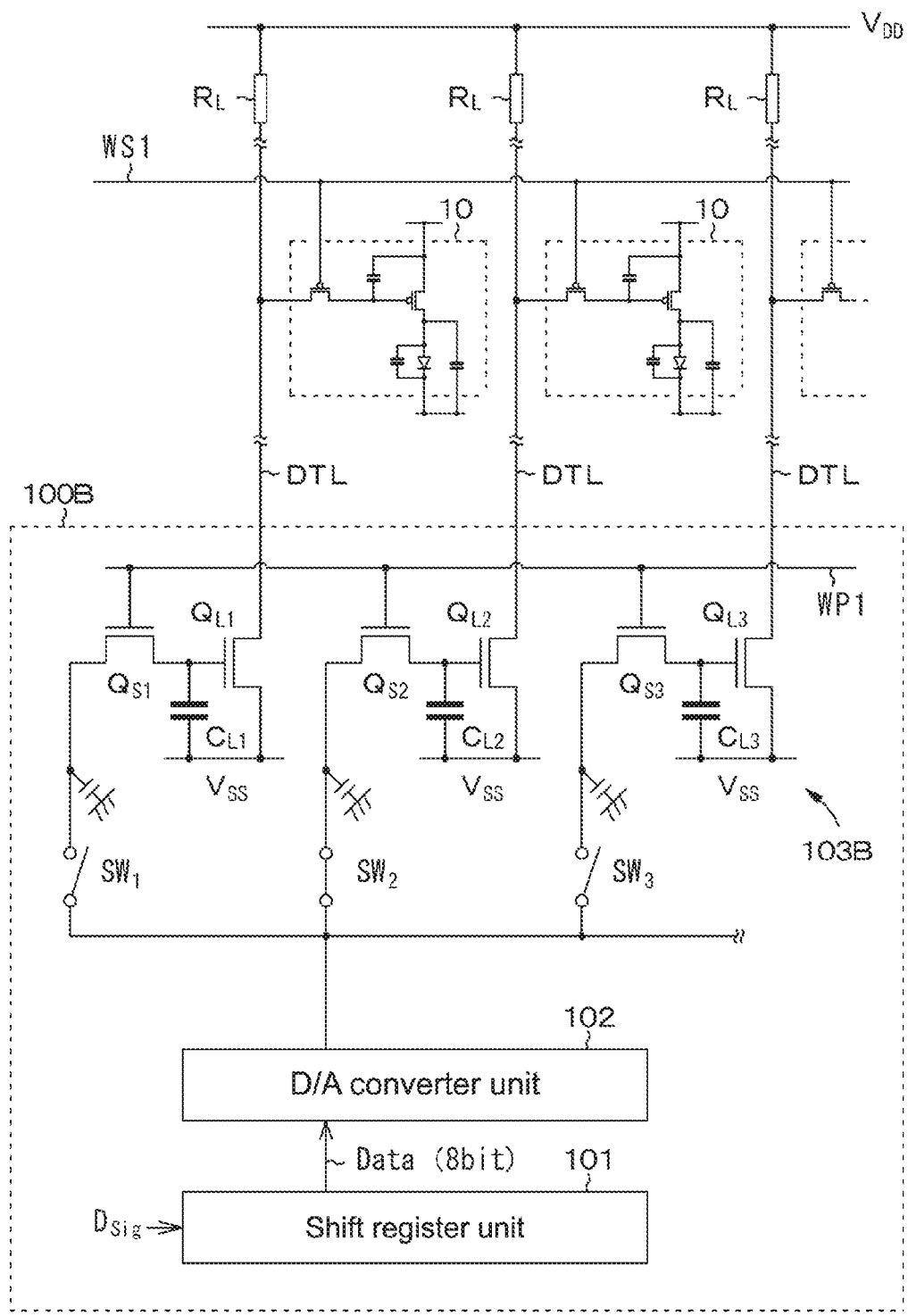
Figure 11:
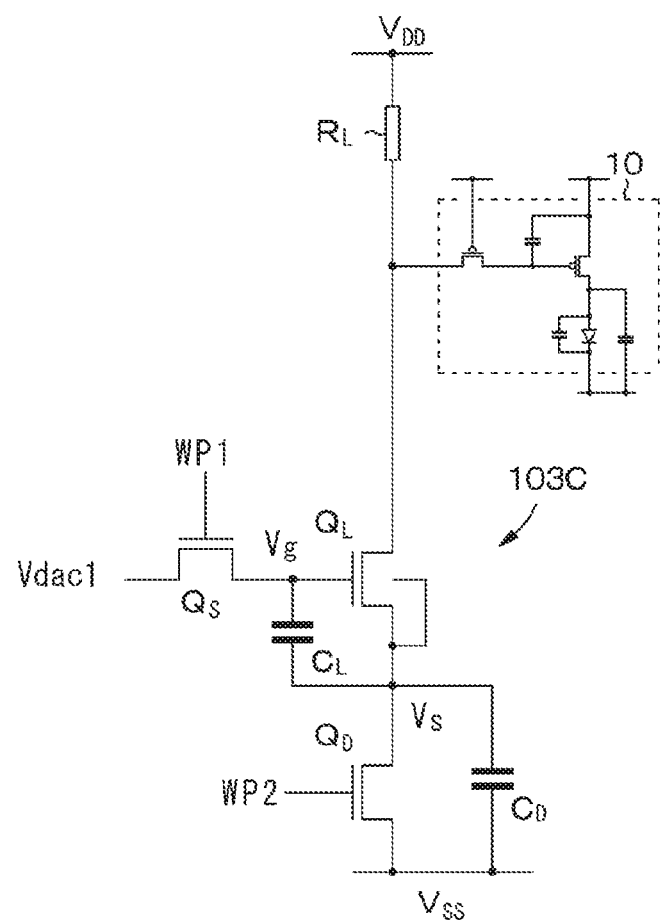

FIG. 11 is a schematic circuit diagram for describing a configuration of a source driver used in a display apparatus of the fourth embodiment and the like. Note that FIG. 11 shows the part of a current source 103C that forms the source driver 100C. As a mode of connection with the D/A converter unit 102, the connection mode described with reference to FIG. 8 or FIG. 10 may be adopted.

The correction circuit that corrects variations in characteristics of the field-effect transistor includes a transistor $Q_S$ that forms a selector, a transistor $Q_D$ that controls connection between a feeder line of a reference voltage $V_{SS}$ and the other source/drain region of the transistor $Q_L$, and a capacitor $C_D$ disposed between the feeder line of the reference voltage $V_{SS}$ and the other source/drain region of the transistor $Q_L$.

The transistors $Q_S$ and $Q_D$ are each formed of an n-channel field-effect transistor, and the conductive state/non-conductive state thereof is respectively controlled by control lines WP1 and WP2.

Figure 12:
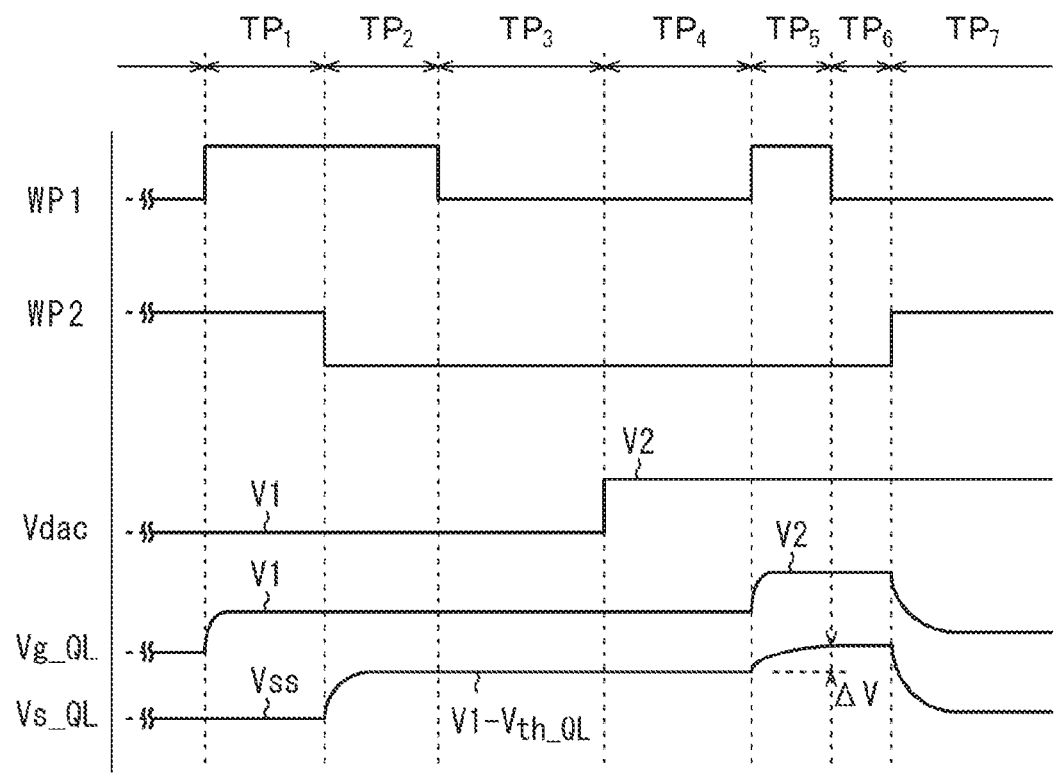
FIG. 12 is a schematic graph for describing an operation of the source driver shown in FIG. 11.

FIG. 12 is a schematic graph for describing the operation of the source driver shown in FIG. 11.

[Period $TP_1$]

In the inception of this period, the control line WP1 is switched to the high level. The control line WP2 maintains the high level. The D/A converter unit 102 outputs a voltage V1 for initialization as an output voltage $V_{dac}$ to the termination of [Period $TP_3$] to be described later.

The transistors $Q_S$ and $Q_D$ are both in the conductive state. Therefore, in the transistor $Q_L$, gate voltage $V_{g\_QL}$=voltage V1, and source voltage $V_{s\_QL}$=voltage $V_{SS}$. Therefore, a gate-source voltage $V_{gs\_QL}$ of the transistor $Q_L$ is (V1−$V_{SS}$). Note that the value of the voltage V1 is assumed to be set such that a condition where $V_{gs\_QL} > V_{th\_QL}$ is satisfied in this state. For example, assuming that $V_{SS}$ is 0 volts and $V_{th\_QL}$ is approximately 3 volts, the voltage V1 only needs to be set to the value of approximately 5 to 10 volts.

[Period $TP_2$]

In the inception of this period, the control line WP2 is switched to the low level. The control line WP1 maintains the high level. The transistor $Q_S$ is in the conductive state, and the transistor $Q_D$ is in the non-conductive state.

The gate voltage $V_{g\_QL}$ of the transistor $Q_L$ maintains the voltage V1. Meanwhile, since the gate-source voltage $V_{gs\_QL}$ of the transistor $Q_L$ exceeds the threshold voltage $V_{th\_QL}$, the current flows in the transistor $Q_L$, and a source voltage $V_{s\_QL}$ rises. When the gate-source voltage $V_{gs\_QL}$ reaches the threshold voltage $V_{th\_QL}$, the transistor $Q_L$ enters the non-conductive state. At that time, the source voltage $V_{s\_QL}$ is (V1−$V_{th\_QL}$).

[Period $TP_3$]

In the inception of this period, the control line WP1 is switched to the low level. The control line WP2 maintains the low level.

The transistors $Q_S$ and $Q_D$ are both in the non-conductive state. Since the former gate-source voltage $V_{gs\_QL}$ is held in the capacitor unit $C_L$, if the transistor $Q_L$ is in the non-conductive state in the [Period $TP_2$], the gate voltage $V_{g\_QL}$ and the source voltage $V_{s\_QL}$ are not changed particularly.

[Period $TP_4$]

In the inception of this period, the D/A converter unit 102 outputs a voltage V2 corresponding to a gradation value of a video to be displayed. Further, the control lines WP1 and WP2 maintain the low level.

As described in the [Period $TP_3$], if the transistor $Q_L$ is in the non-conductive state in the [Period $TP_2$], the gate voltage $V_{g\_QL}$ and the source voltage $V_{s\_QL}$ are not changed particularly.

[Period $TP_5$]

In the inception of this period, the control line WP1 is switched to the high level. The control line WP2 maintains the low level.

The transistor $Q_S$ is in the conductive state, and the transistor $Q_D$ is in the non-conductive state. A voltage V2 is applied to the gate of the transistor $Q_L$. Since the gate-source voltage $V_{gs\_QL}$ of the transistor $Q_L$ exceeds the threshold voltage $V_{th\_QL}$, the current flows in the transistor $Q_L$. As a result, a source voltage $V_{s\_QL}$ rises. The rise is represented by $\Delta V$.

[Period $TP_6$]

In the inception of this period, the control line WP1 is switched to the low level. The control line WP2 maintains the low level.

The transistors $Q_S$ and $Q_D$ are in the non-conductive state. At that time, the gate-source voltage $V_{gs\_QL}$ of the transistor $Q_L$ is represented by the following expression (3).

$$V_{gs\_QL} = V2 + V_{th\_QL} - \Delta V \quad (3)$$

Therefore, a voltage corrected according to the value of the threshold voltage $V_{th\_QL}$ of the field-effect transistor $Q_L$ is held in the capacitor unit $C_L$ connected between the gate and the source of the field-effect transistor $Q_L$.

The above-mentioned rise $\Delta V$ of the potential will be described. In the [Period $TP_5$], as the current flowing in the transistor $Q_L$ increases, the $\Delta V$ becomes larger. Since the current flowing in the transistor $Q_L$ is proportional to mobility $\mu$, the $\Delta V$ eventually tends to becomes larger as the value of the mobility $\mu$ of the transistor $Q_L$ becomes larger.

[Period $TP_7$]

In the inception of this period, the control line WP2 is switched to the high level. The control line WP1 maintains the low level.

The transistor $Q_S$ is in the non-conductive state, and the transistor $Q_D$ is in the conductive state. The current flows in the transistor $Q_L$. Further, the source voltage $V_{s\_QL}$ is a reference voltage $V_{SS}$. Since the capacitor $C_{L1}$ holds the voltage shown in the above-mentioned expression (3), a phenomenon similar to that of a bootstrap circuit occurs. In other words, while the gate-source voltage $V_{gs\_QL}$ is held, the gate voltage $V_{g\_QL}$ also changes.

The drain current flowing in the transistor $Q_L$ is represented by the following expression (4) on the basis of the above-mentioned expressions (3) and (1).

$$I_{ds} = k \cdot \mu \cdot ((V2 + V_{th\_QL} - \Delta V) - V_{th\_QL})^2 \quad (4)$$
$$= k \cdot \mu \cdot (V2 - \Delta V)^2$$

Therefore, the current $I_{ds}$ flowing in the transistor $Q_L$ is proportional to the square of a value obtained by subtracting the value of the rise $\Delta V$, which results from the mobility $\mu$ of the transistor $Q_L$, from the value of a write voltage V2 from the D/A converter unit 102. The current $I_{ds}$ flowing in the transistor $Q_L$ does not depend on the threshold voltage $V_{th\_QL}$. Therefore, the variations in the threshold voltage $V_{th\_QL}$ do not affect the drain current $I_{ds}$.

In addition, since the transistor $Q_L$ having a larger mobility $\mu$ has a greater $\Delta V$, the expression (4) shows a relationship in which when the value of the mobility $\mu$ increases, the value of $(V2-\Delta V)^2$ decreases. Thus, variations in drain current, which result from the variations in mobility $\mu$ (furthermore, variations in k) can also be corrected.

Note that when the transistor $Q_D$ is in the non-conductive state, the source of the transistor $Q_L$ and the reference voltage $V_{SS}$ are disconnected from each other. When the above-mentioned drive is performed by using a circuit including a MOS transistor, a substrate bias effect generated by a potential difference between the body and the source changes the threshold voltage of the transistor $Q_L$ between the conductive state and the non-conductive state of the transistor $Q_D$. Therefore, it is desirable that well isolation is performed on the transistor $Q_L$ forming the current source, and a well potential and a source potential are caused to coincide with each other, so that the influence of the substrate bias effect is eliminated.

FIFTH EMBODIMENT

The fifth embodiment also relates to a source driver and a display apparatus according to the first aspect of the present disclosure.

In a schematic view of a display apparatus 1D according to the fifth embodiment, it is only necessary to consider the display apparatus 1 as a display apparatus 1D and consider the source driver 100 as a source driver 100D in FIG. 1.

In the above-mentioned fourth embodiment, the voltage corresponding to the gradation value of the video to be displayed is written in the [Period $TP_5$] shown in FIG. 12. Further, at that time, the source voltage $V_{s\_QL}$ of the transistor $Q_L$ is caused to rise, to thus compensate for the influence of the variations in mobility μ.

However, in a case where the current source is formed of a transistor whose on-state current characteristics are excellent, the source voltage $V_{s\_QL}$ rises sharply in the [Period $TP_5$] shown in FIG. 12, and it is conceivable that the operation is hindered unless the pulse width is extremely narrowed, for example. If the capacitor $C_D$ shown in FIG. 11 has a larger capacitance, the rise of the source voltage $V_{s\_QL}$ can be made gentle, but this increases the circuit scale.

In this regard, the fifth embodiment has a configuration to prevent the source voltage $V_{s\_QL}$ of the transistor $Q_L$ from rising when the voltage corresponding to the gradation value of the video to be displayed is written.

Figure 13:
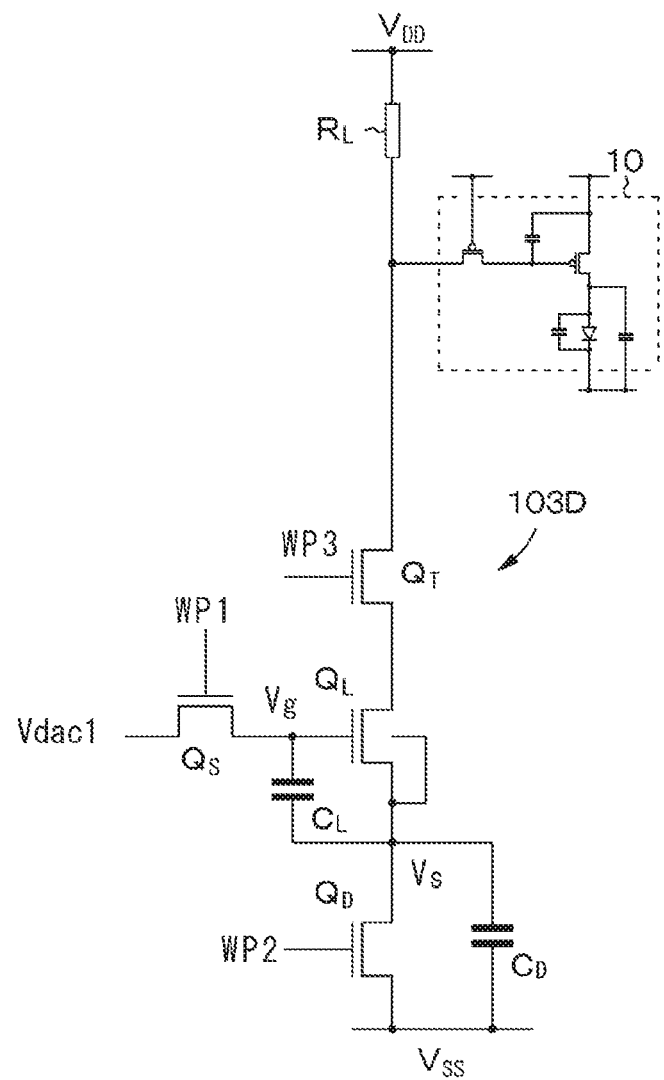

FIG. 13 is a schematic circuit diagram for describing a configuration of a source driver used in the display apparatus of the fifth embodiment and the like. Note that FIG. 13 shows the part of a current source 103D that forms the source driver 100D. As a mode of connection with the D/A converter unit 102, the connection mode described with reference to FIG. 8 or FIG. 10 may be adopted.

As shown in FIG. 13, the current source 103D has a configuration in which a transistor $Q_T$ is added to the current source 103C shown in FIG. 11. The transistor $Q_T$ is formed of an n-channel field-effect transistor, and the conductive state/non-conductive state thereof is controlled by a control line WP3.

Figure 14:
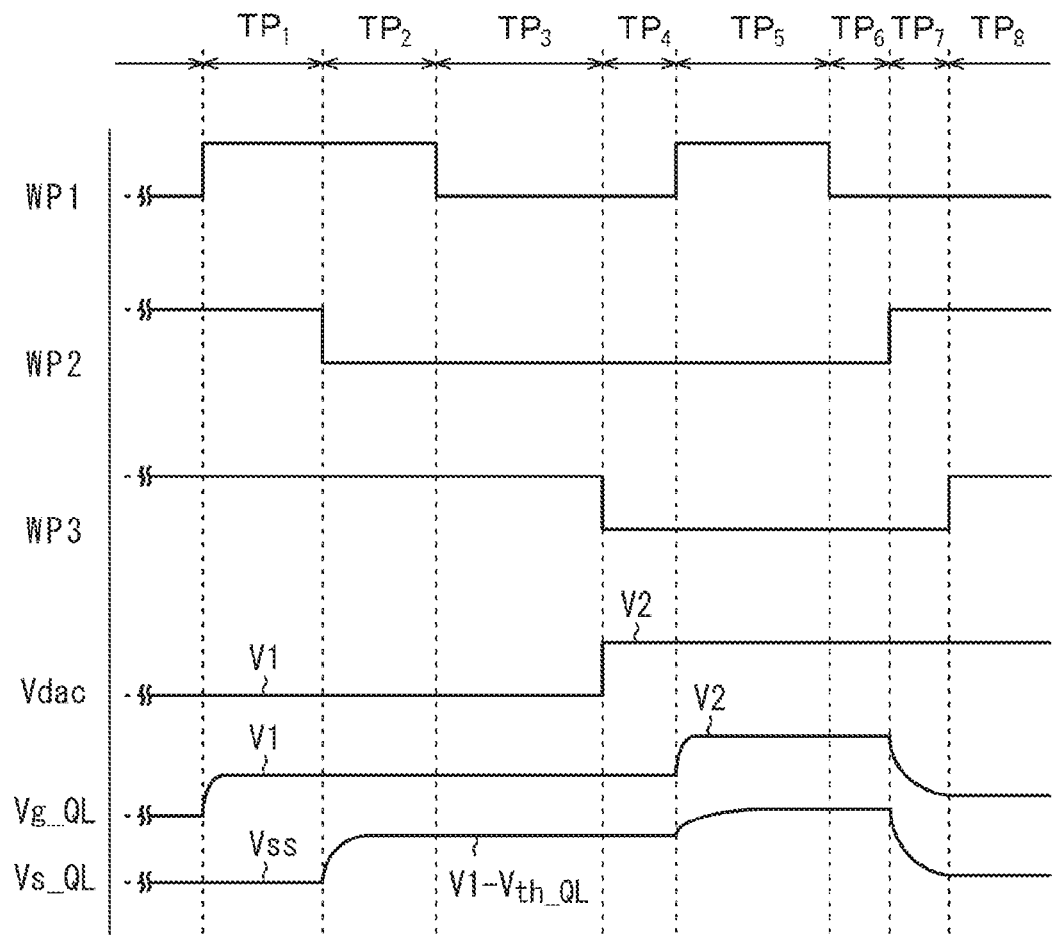
FIG. 14 is a schematic graph for describing an operation of the source driver shown in FIG. 13.

FIG. 14 is a schematic graph for describing the operation of the source driver shown in FIG. 13.

[Period $TP_1$] to [Period $TP_3$]

In this period, the operation is similar to that described in the fourth embodiment with reference to FIG. 12 except that the control line WP3 is in the high level and the transistor $Q_T$ is in the conductive state. Therefore, the description will be omitted.

[Period $TP_4$] to [Period $TP_7$]

In this period, the operation is basically similar to that described in the fourth embodiment with reference to FIG. 12 except that the control line WP3 is in the low level and the transistor $Q_T$ is in the non-conductive state.

In the fourth embodiment, the voltage corresponding to the gradation value of the video to be displayed is written in the [Period $TP_5$], and at that time, the current is caused to flow in the transistor $Q_L$, to thus raise the source voltage. In the fifth embodiment, the transistor $Q_T$ is in the non-conductive state, and thus the current does not flow in the transistor $Q_L$.

Note that the gate voltage changes from the voltage V1 to the voltage V2 in the inception of [Period $TP_5$], and thus the source voltage $V_{s\_QL}$ changes somewhat by coupling. FIG. 14 shows waveforms on the assumption that the influence of the coupling is present.

[Period $TP_8$]

In the inception of this period, the control line WP3 is switched to the high level. The transistor $Q_T$ is in the conductive state. Basically, a drain current in which ΔV is removed from the above-mentioned expression (4) flows.

[Electronic Apparatus]

The display apparatus of the present disclosure that has been described above can be used as a display unit (display apparatus) of an electronic apparatus in any filed, the display unit (display apparatus) displaying, as an image or a video, a video signal input to the electronic apparatus or a video signal generated within the electronic apparatus. By way of example, the display unit can be used as a display unit of a television set, a digital still camera, a lap-top personal computer, a portable terminal apparatus such as a mobile phone, a video camera, a head mounted display (head-mounted type display), or the like.

The display apparatus of the present disclosure includes a module-shaped display apparatus having a sealed configuration. By way of example, a display module that is formed by attaching a facing portion formed of transparent glass or the like to a pixel array unit corresponds to the display apparatus. Note that the display module may include a circuit unit for inputting/outputting signals or the like from the outside to the pixel array unit, a flexible printed circuit (FPC), or the like. Hereinafter, a digital still camera and a head mounted display are exemplified as specific examples of the electronic apparatus using the display apparatus of the present disclosure. It should be noted that the specific examples described herein are merely illustrative, and the present disclosure is not limited thereto.

SPECIFIC EXAMPLE 1

Figure 15A:
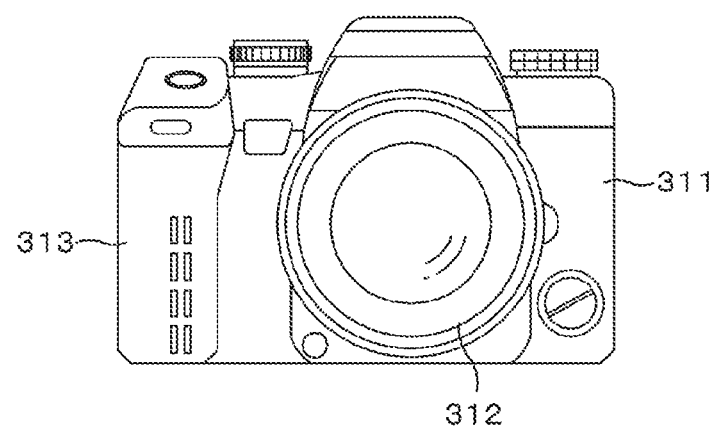
FIG. 15A shows a front view thereof and FIG. 15B shows a rear view thereof.
Figure 15B:
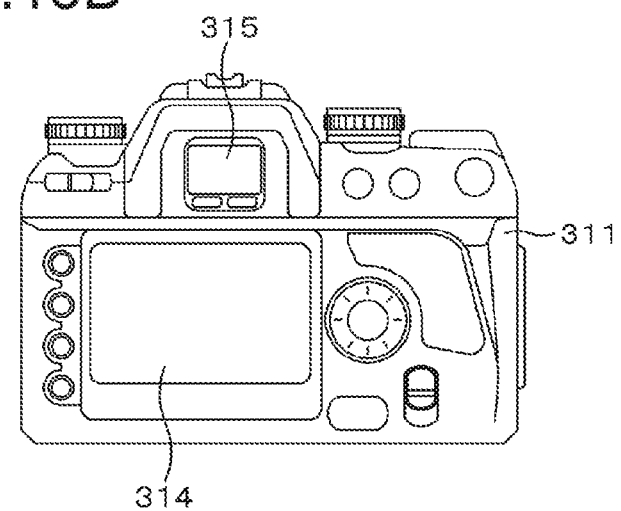

FIG. 15 is an outer appearance view of a digital still camera of a lens-interchangeable and single-lens-reflex type, in which FIG. 15A shows a front view thereof and FIG. 15B shows a rear view thereof. The digital still camera of a lens-interchangeable and single-lens-reflex type includes, for example, an interchangeable imaging lens unit (interchangeable lens) 312 on the right side of the front of a camera main body portion (camera body) 311, and a grip portion 313 to be gripped by a photographer on the left side of the front thereof.

Further, a monitor 314 is provided at substantially the center of the back of the camera main body portion 311. A viewfinder (eyepiece window) 315 is provided above the monitor 314. A photographer can visually recognize an optical image of a subject, which is derived from the imaging lens unit 312, and then determine the composition by looking through the viewfinder 315.

In the digital still camera of a lens-interchangeable and single-lens-reflex type having the configuration described above, the display apparatus of the present disclosure can be used as the viewfinder 315 of the digital still camera. In other words, the digital still camera of a lens-interchangeable and single-lens-reflex type according to this example is produced by using the display apparatus of the present disclosure as the viewfinder 315 of the digital still camera.

SPECIFIC EXAMPLE 2

Figure 16:
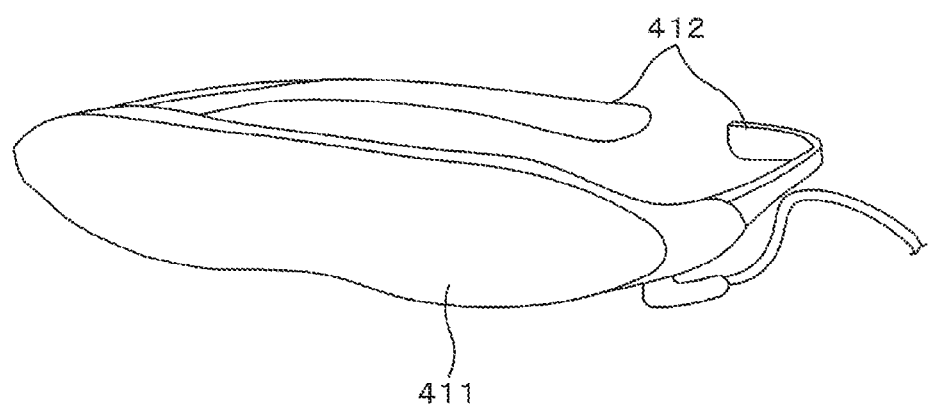
FIG. 16 is an outer appearance view of a head mounted display.

FIG. 16 is an outer appearance view of a head mounted display. The head mounted display includes, for example, temple portions 412 on the both sides of an eyeglass-shaped display unit 411. The temple portions 412 are used to be mounted to the head of a user. In this head mounted display, the display apparatus of the present disclosure can be used as the display unit 411 of the head mounted display. In other words, the head mounted display according to this example is produced by using the display apparatus of the present disclosure as the display unit 411 of the head mounted display.

SPECIFIC EXAMPLE 3

Figure 17:
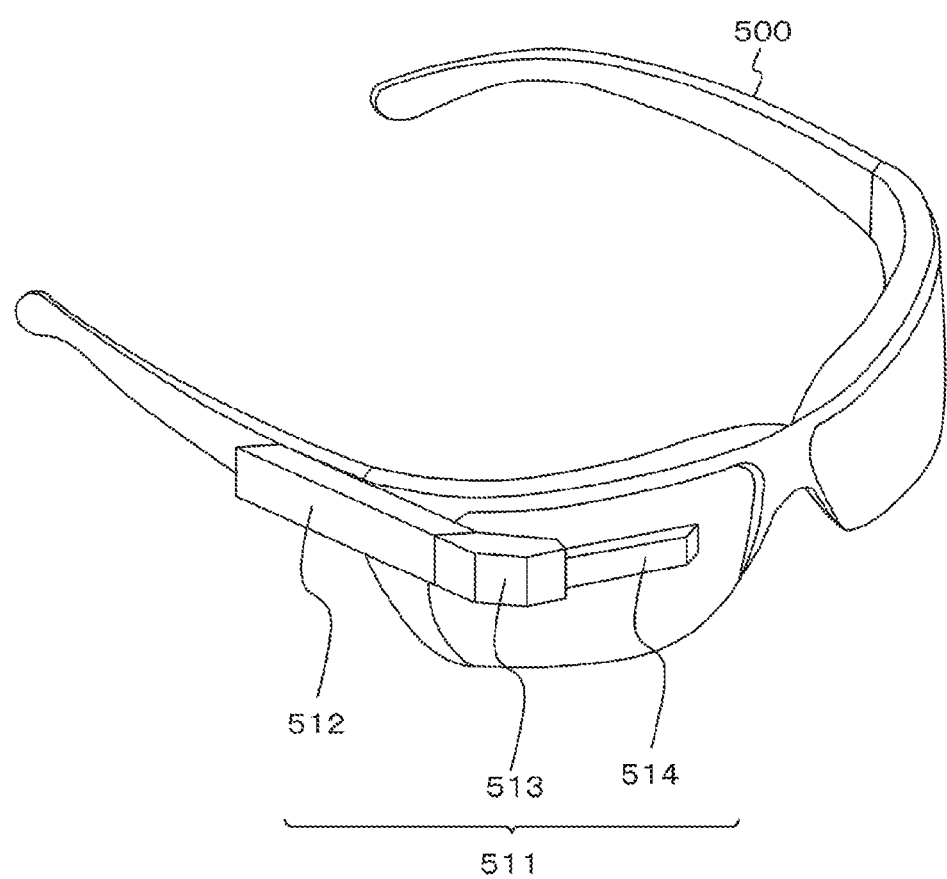
FIG. 17 is an outer appearance view of a see-through head mounted display.

FIG. 17 is an outer appearance view of a see-through head mounted display. A see-through head mounted display 511 includes a main body portion 512, an arm 513, and a lens tube 514.

The main body portion 512 is connected to the arm 513 and eyeglasses 500. Specifically, the end portion of the main body portion 512 in the long-side direction is coupled to the arm 513, and one of the side surfaces of the main body portion 512 is coupled to the eyeglasses 500 via a connection member. It should be noted that the main body portion 512 may be directly mounted to the head of a human body.

The main body portion 512 incorporates a control board for controlling the operation of the see-through head mounted display 511, and a display unit. The arm 513 connects the main body portion 512 and the lens tube 514 to each other and supports the lens tube 514. Specifically, the arm 513 is coupled to the end portion of the main body portion 512 and the end portion of the lens tube 514 and fixes the lens tube 514. Further, the arm 513 incorporates a signal line for communication of data related to an image provided to the lens tube 514 from the main body portion 512.

The lens tube 514 projects image light, which is provided from the main body portion 512 via the arm 513, through an eyepiece lens toward the eyes of the user wearing the see-through head mounted display 511. In this see-through head mounted display 511, the display apparatus of the present disclosure can be used for the display unit of the main body portion 512.

[Others]

It should be noted that the technology of the present disclosure can also have the following configurations.

[A1]
A source driver, which is used for supplying a voltage corresponding to a gradation value of a video signal to a data line of a display unit, the source driver including:
a resistor having an end to which a predetermined power supply voltage is applied; and
a current source that is connected to another end of the resistor, the amount of current of the current source being controlled according to the gradation value of the video signal, the voltage corresponding to the gradation value of the video signal being supplied from the other end of the resistor.

[A2]
The source driver according to [A1], in which
the other end of the resistor and the current source are connected to each other via the data line.

[A3]
The source driver according to [A1], in which
a connection point of the other end of the resistor and the current source is connected to the data line.

[A4]
The source driver according to [A1] to [A3], in which
the amount of current of the current source is controlled by an output voltage of a D/A converter unit that outputs the voltage corresponding to the gradation value of the video signal.

[A5]
The source driver according to [A4], further including
a selector circuit that causes a plurality of current sources to correspond to a single output unit of the D/A converter unit.

[A6]
The source driver according to [A5], in which
each of the plurality of current sources includes a capacitor unit that holds a voltage supplied from the D/A converter unit.

[A7]
The source driver according to [A1] to [A6], in which
the current source includes a transistor.

[A8]
The source driver according to [A7], in which
the current source includes a field-effect transistor and further includes a correction circuit that corrects variations in characteristics of the field-effect transistor.

[A9]
The source driver according to [A8], in which
the correction circuit performs correction corresponding to a value of a threshold voltage of the field-effect transistor.

[A10]
The source driver according to [A9], in which
the correction circuit causes the capacitor unit to hold a voltage that is corrected according to the value of the threshold voltage of the field-effect transistor, the capacitor unit being connected between a gate and a source of the field-effect transistor.

[B1]
A display apparatus, including:
a display unit; and
a source driver that is used for supplying a voltage corresponding to a gradation value of a video signal to a data line of the display unit, the source driver including
a resistor having an end to which a predetermined power supply voltage is applied, and
a current source that is connected to another end of the resistor, the amount of current of the current source being controlled according to the gradation value of the video signal, the voltage corresponding to the gradation value of the video signal being supplied from the other end of the resistor to the data line.

[B2]
The display apparatus according to [B1], in which
the display unit includes a display element that is configured to provide a blacker display as a voltage supplied to the data line approaches a predetermined power supply voltage.

[B3]
The display apparatus according to [B2], in which
the display element at least includes
a current-driven light-emitting unit,
a storage capacitor that holds a voltage supplied from the data line, and
a drive transistor that provides a current corresponding to the voltage held by the storage capacitor to the light-emitting unit.

[B4]
The display apparatus according to [B1] to [B3], in which
the other end of the resistor and the current source are connected to each other via the data line.

[B5]
The display apparatus according to [B1] to [B3], in which
a connection point of the other end of the resistor and the current source is connected to the data line.

[B6]
The display apparatus according to [B1] to [B5], in which
the amount of current of the current source is controlled by an output voltage of a D/A converter unit that outputs the voltage corresponding to the gradation value of the video signal.

[B7]
The display apparatus according to [B6], further including
a selector circuit that causes a plurality of current sources to correspond to a single output unit of the D/A converter unit.

[B8]
The display apparatus according to [B7], in which
each of the plurality of current sources includes a capacitor unit that holds a voltage supplied from the D/A converter unit.

[B9]
The display apparatus according to [B1] to [B8], in which
the current source includes a transistor.

[B10]
The display apparatus according to [B9], in which
the current source includes a field-effect transistor and further includes a correction circuit that corrects variations in characteristics of the field-effect transistor.

[B11]
The display apparatus according to [B10], in which
the correction circuit performs correction corresponding to a value of a threshold voltage of the field-effect transistor.

[B12]
The display apparatus according to [B11], in which
the correction circuit causes the capacitor unit to hold a voltage that is corrected according to the value of the threshold voltage of the field-effect transistor, the capacitor unit being connected between a gate and a source of the field-effect transistor.

[C1]
An electronic apparatus, including
a display apparatus that includes
a display unit, and
a source driver that is used for supplying a voltage corresponding to a gradation value of a video signal to a data line of the display unit, the source driver including
a resistor having an end to which a predetermined power supply voltage is applied, and
a current source that is connected to another end of the resistor, the amount of current of the current source being controlled according to the gradation value of the video signal, the voltage corresponding to the gradation value of the video signal being supplied from the other end of the resistor to the data line.

[C2]
The electronic apparatus according to [C1], in which
the display unit includes a display element that is configured to provide a blacker display as a voltage supplied to the data line approaches a predetermined power supply voltage.

[C3]
The electronic apparatus according to [C2], in which
the display element at least includes
a current-driven light-emitting unit,
a storage capacitor that holds a voltage supplied from the data line, and
a drive transistor that provides a current corresponding to the voltage held by the storage capacitor to the light-emitting unit.

[C4]
The electronic apparatus according to [C1] to [C3], in which
the other end of the resistor and the current source are connected to each other via the data line.

[C5]
The electronic apparatus according to [C1] to [C3], in which
a connection point of the other end of the resistor and the current source is connected to the data line.

[C6]
The electronic apparatus according to [C1] to [C5], in which
the amount of current of the current source is controlled by an output voltage of a D/A converter unit that outputs the voltage corresponding to the gradation value of the video signal.

[C7]
The electronic apparatus according to [C6], further including
a selector circuit that causes a plurality of current sources to correspond to a single output unit of the D/A converter unit.

[C8]
The electronic apparatus according to [C7], in which
each of the plurality of current sources includes a capacitor unit that holds a voltage supplied from the D/A converter unit.

[C9]
The electronic apparatus according to [C1] to [C8], in which
the current source includes a transistor.

[C10]
The electronic apparatus according to [C9], in which
the current source includes a field-effect transistor and further includes a correction circuit that corrects variations in characteristics of the field-effect transistor.

[C11]
The electronic apparatus according to [C10], in which
the correction circuit performs correction corresponding to a value of a threshold voltage of the field-effect transistor.

[C12]
The electronic apparatus according to [C11], in which
the correction circuit causes the capacitor unit to hold a voltage that is corrected according to the value of the threshold voltage of the field-effect transistor, the capacitor unit being connected between a gate and a source of the field-effect transistor.

REFERENCE SIGNS LIST 1, 1A, 1B, 1C, 1D display apparatus
2 display panel
10 display element
21 support
22 transparent substrate
31 gate electrode
32 gate insulating layer 33 semiconductor layer
34 channel forming region
35A one source/drain region
35B the other source/drain region
36 one electrode
37 the other electrode
38, 39 wiring
40 interlayer insulating layer
51 anode electrode
52 hole transport layer, light-emitting layer, and electron transport layer
53 cathode electrode
54 second interlayer insulating layer
55, 56 contact hole
100, 900 source driver
101, 901 shift register unit
102, 902 D/A converter unit
103, 103A, 103B, 103C, 103D current source
903 voltage follower amplifier
904 level shifter unit
905 selector circuit
$TR_W$ write transistor
$TR_D$ drive transistor
$C_S$ capacitor unit
ELP organic electroluminescence light-emitting unit
$C_{EL}$ capacitor of light-emitting unit ELP
$C_{sub}$ auxiliary capacitor
$Q_L$, $Q_{L1}$, $Q_{L2}$, $Q_{L3}$ transistor forming current source
$R_L$ resistor
$C_L$, $C_D$ capacitor
$Q_S$, $Q_{S1}$, $Q_{S2}$, $Q_{S3}$, $Q_D$ transistor used for switching
$Q_{11}$, $Q_{12}$, $Q_{13}$, $Q_{14}$, $Q_{15}$, $C_G$ transistor forming voltage follower amplifier and capacitor
WS1 scanning line
DTL data line
PS1 feeder line
PS2 common feeder line
WP1, WP2, WP3 control line
311 camera main body portion
312 imaging lens unit
313 grip portion
314 monitor
315 viewfinder
500 eyeglasses
511 see-through head mounted display
512 main body portion
513 arm
514 lens tube

The invention claimed is:

1. A source driver comprising:
a current source configured to supply, to an output of the current source, an amount of current according to a gradation value of a video signal;
a data line configured to electrically connect the output of the current source to a source/drain region of a transistor; and
a resistor that has:
a first end of the resistor that is configured to receive a power supply voltage, and
a second end of the resistor that is electrically connected to the output of the current source,
wherein the current source is electrically connected directly to the source/drain region of the transistor.

2. The source driver according to claim 1, wherein the output of the current source is electrically connected directly to the source/drain region of the transistor.

3. The source driver according to claim 1, wherein the second end of the resistor is electrically connected directly to the output of the current source.

4. The source driver according to claim 1, wherein a scanning line is electrically connected to a gate electrode of the write transistor.

5. The source driver according to claim 1, wherein the data line is configured to electrically connect the output of the current source to a source/drain region of an additional transistor.

6. The source driver according to claim 1, wherein the data line is electrically connected directly to the source/drain region of the transistor.

7. The source driver according to claim 1, wherein another source/drain region of the transistor is electrically connected to a gate electrode of another transistor.

8. The source driver according to claim 1, wherein a D/A converter is configured to supply, to the current source, a voltage that corresponds to the gradation value the video signal.

9. The source driver according to claim 8, wherein the current source is configured to convert the voltage into the amount of current.

10. The source driver according to claim 8, wherein a capacitor unit in the current source holds the voltage.

11. The source driver according to claim 1, wherein the current source is another transistor.

12. The source driver according to claim 1, wherein the current source comprises a correction circuit that corrects variations in characteristics of the current source.

13. A display apparatus comprising:
the source driver according to claim 1; and
a display unit.

14. The display apparatus according to claim 13, wherein the display unit comprises a display element, the display element is configured to provide a blacker display as a voltage supplied to the data line approaches a predetermined power supply voltage.

15. The display apparatus according to claim 14, wherein the display unit is configured to provide the blacker display as a voltage supplied to the data line approaches the power supply voltage.

16. An electronic apparatus comprising:
the display apparatus according to claim 13.

17. A source driver comprising:
a current source configured to supply, to an output of the current source, an amount of current according to a gradation value of a video signal;
a data line configured to electrically connect the output of the current source to a source/drain region of a transistor; and
a resistor that has:
a first end of the resistor that is configured to receive a power supply voltage, and
a second end of the resistor that is electrically connected to the output of the current source,
wherein:
a D/A converter is configured to supply, to the current source, a voltage that corresponds to the gradation value the video signal,
a capacitor unit in the current source holds the voltage, and
the capacitor unit is electrically connected between a gate electrode of the current source and a source region of the current source.

18. The source driver according to claim 17, wherein the gate electrode of the current source is configured to receive the voltage.

19. The source driver according to claim 17, wherein the source region of the current source is electrically connected directly to the source/drain region of the transistor.

\* \* \* \* \*